United States Patent
Rabinovitz

Patent Number: 5,992,953
Date of Patent: *Nov. 30, 1999

[54] ADJUSTABLE INTERLOCKING SYSTEM FOR COMPUTER PERIPHERAL AND OTHER DESKTOP ENCLOSURES

[76] Inventor: Josef Rabinovitz, c/o JMR Electronics, Inc., 20400 Plummer St., Chatsworth, Calif. 91311

[*] Notice: This patent is subject to a terminal disclaimer.

[21] Appl. No.: 08/911,384

[22] Filed: Aug. 12, 1997

Related U.S. Application Data

[63] Continuation-in-part of application No. 08/613,260, Mar. 8, 1996, Pat. No. 5,788,347, application No. 29/051,460, Mar. 8, 1996, Pat. No. Des. 387,969, and application No. 29/071,247, May 23, 1997.

[51] Int. Cl.$^6$ .................................................. F16B 12/10
[52] U.S. Cl. ..................... 312/111; 403/329; 403/388; 439/701; 439/717; 312/223.2
[58] Field of Search .................. 312/223.1, 223.2, 312/107, 108, 111; 439/353, 357, 358, 701, 717; 361/683, 725, 726, 727; 403/329, 326, 388

[56] References Cited

U.S. PATENT DOCUMENTS

| | | |
|---|---|---|
| D. 194,759 | 3/1963 | Marett . |
| D. 387,969 | 12/1997 | Rabinovitz ................................ D8/349 |
| 3,552,579 | 1/1971 | Simon et al. ........................ 312/111 X |
| 3,851,981 | 12/1974 | Corsi et al. . |
| 4,036,371 | 7/1977 | Michel . |
| 4,105,348 | 8/1978 | Anderson . |
| 4,239,306 | 12/1980 | Klaus . |
| 4,353,470 | 10/1982 | Polhemus et al. ....................... 211/126 |
| 4,501,460 | 2/1985 | Sisler . |
| 4,558,914 | 12/1985 | Prager et al. . |
| 4,632,594 | 12/1986 | Del Tufo et al. . |
| 4,648,737 | 3/1987 | Lake, Jr. et al. . |
| 4,774,792 | 10/1988 | Ballance . |
| 4,996,628 | 2/1991 | Harvey et al. . |
| 5,122,077 | 6/1992 | Maejima et al. ........................ 439/398 |
| 5,156,556 | 10/1992 | Ma . |
| 5,218,760 | 6/1993 | Colton et al. . |
| 5,227,957 | 7/1993 | Deters ............................... 312/223.2 X |
| 5,235,493 | 8/1993 | Yu . |
| 5,253,133 | 10/1993 | Guo . |
| 5,288,251 | 2/1994 | Sumida .................................... 439/701 |
| 5,480,117 | 1/1996 | Fleming, III . |
| 5,484,223 | 1/1996 | Saito . |
| 5,586,002 | 12/1996 | Notarianni .............................. 361/681 |
| 5,604,662 | 2/1997 | Anderson et al. . |
| 5,612,854 | 3/1997 | Wiscombe et al. ..................... 361/727 |
| 5,788,347 | 8/1998 | Rabinovitz .............................. 312/111 |

Primary Examiner—Peter M. Cuomo
Assistant Examiner—Stephen Vu
Attorney, Agent, or Firm—Oppenheimer Wolff & Donnelly LLP

[57] ABSTRACT

First and second L-shaped brackets are secured to first and second computer peripheral units. The upright back portions of both of the brackets have holes or openings in them. With the first unit stacked on the second and their respective brackets aligned, a first male member of a connector device is snap fit in a hole in one of the brackets and a second male member of that device is snap fit in a hole in the other bracket. The two brackets and connector device form a connector assembly, which with (three) other similar assemblies, hold the stacked unit together. Bottom members, top cap members and/or center members can be snap fit onto the brackets to provide flexibility in use and to provide a smooth attractive outer appearance. According to one preferred embodiment, the assemblies can be disassembled without tools. The brackets, connector device, and the other members can be sold as a kit together with differently-sized brackets to accommodate different sizes (heights) of units.

26 Claims, 27 Drawing Sheets

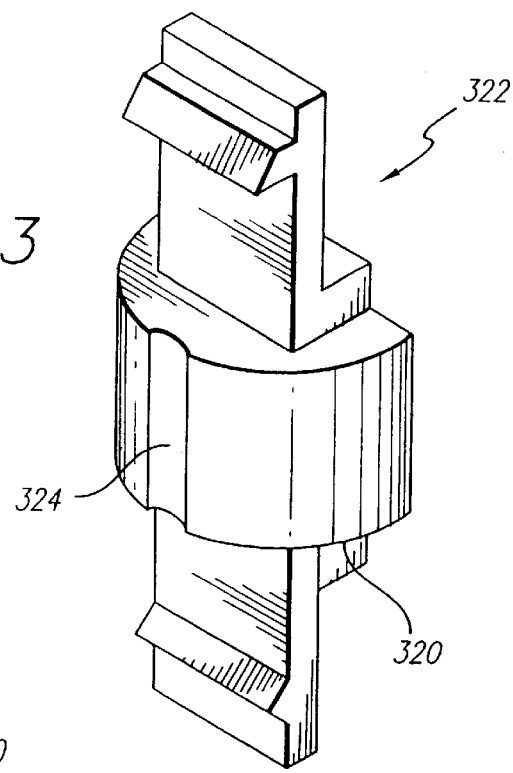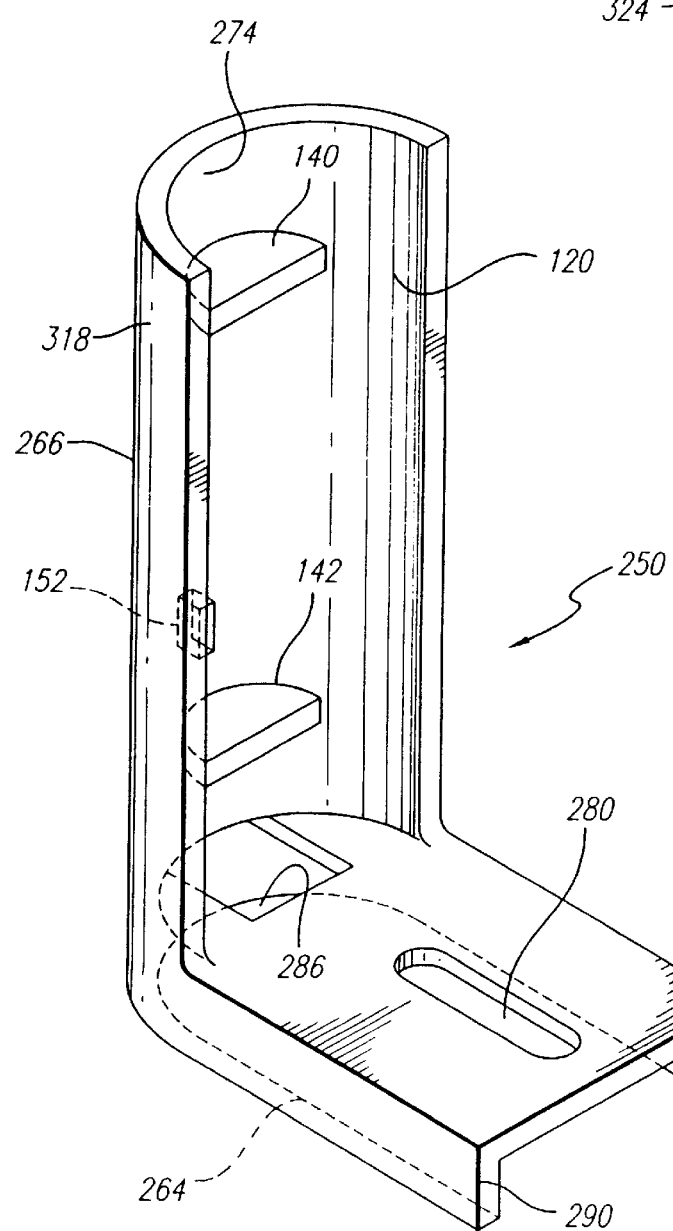

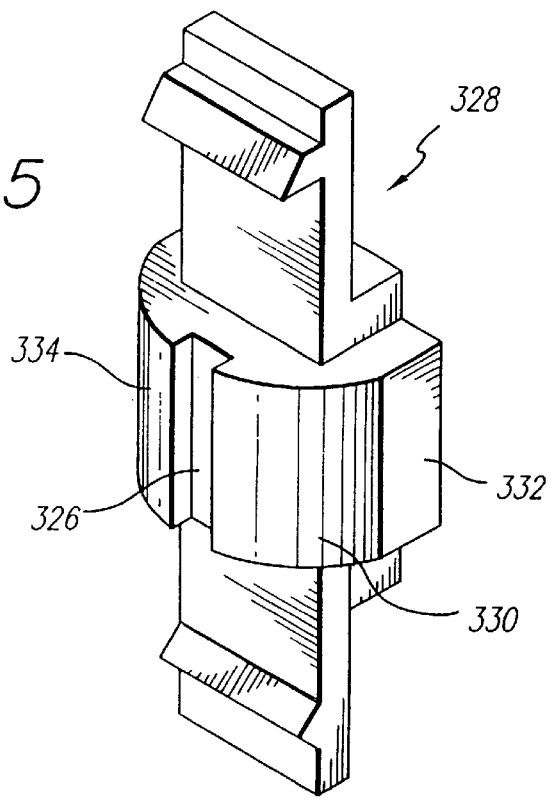
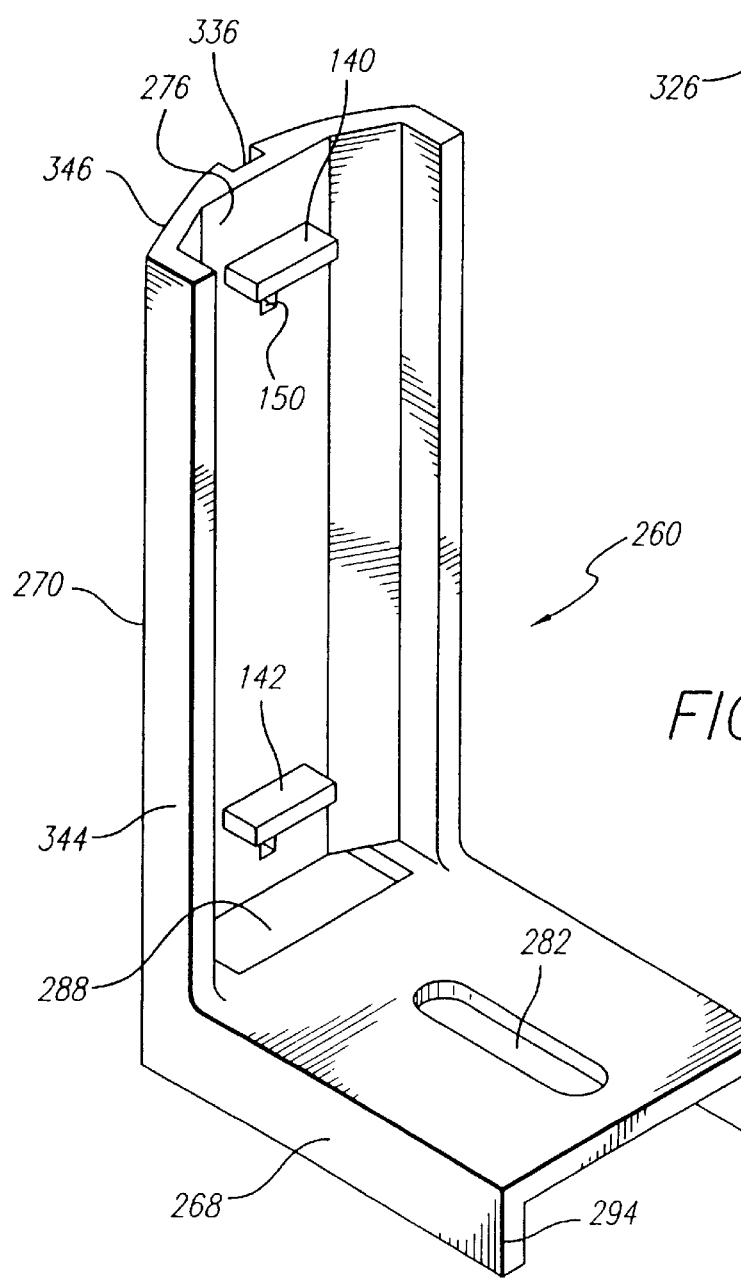

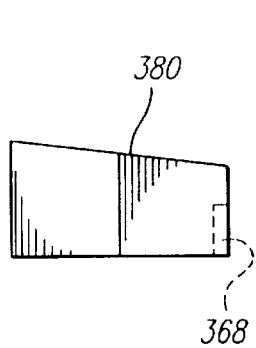
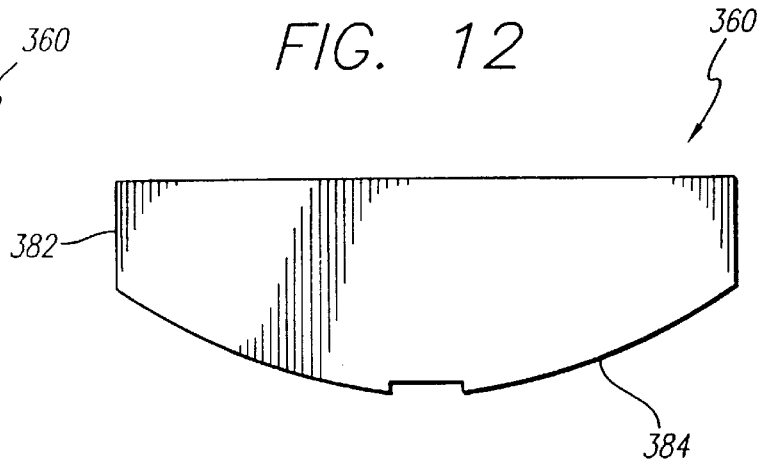
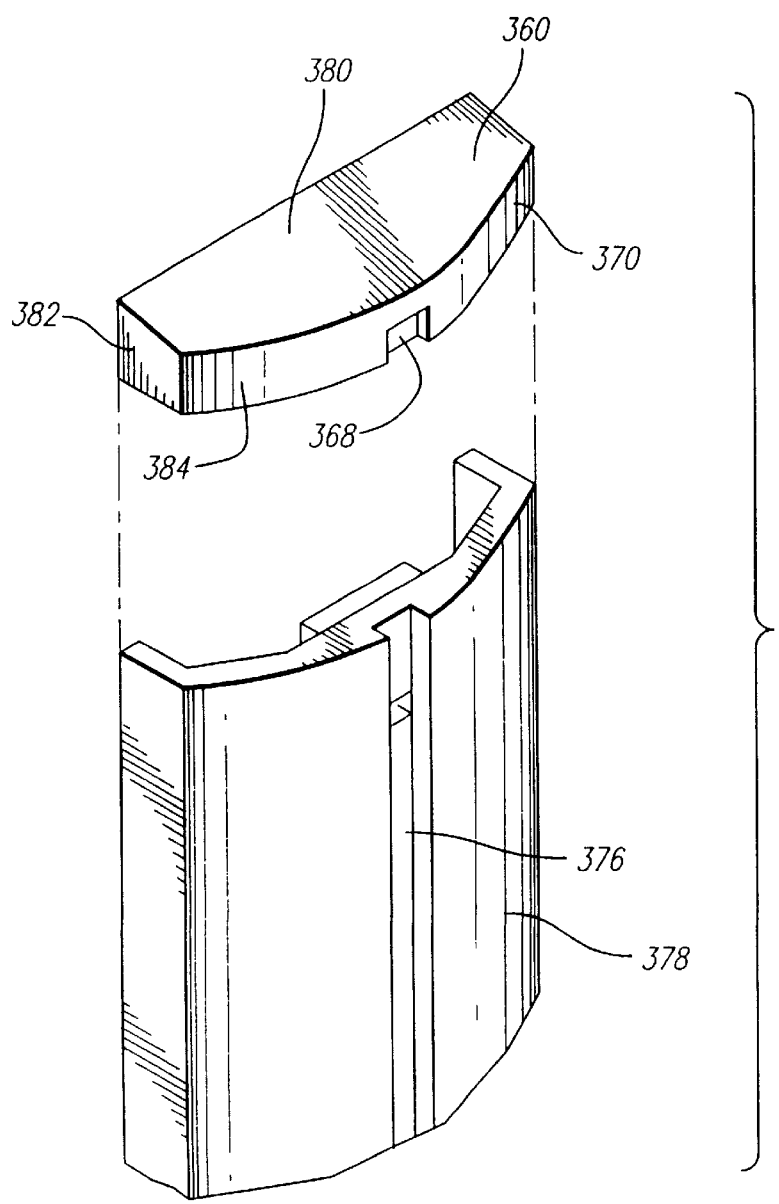

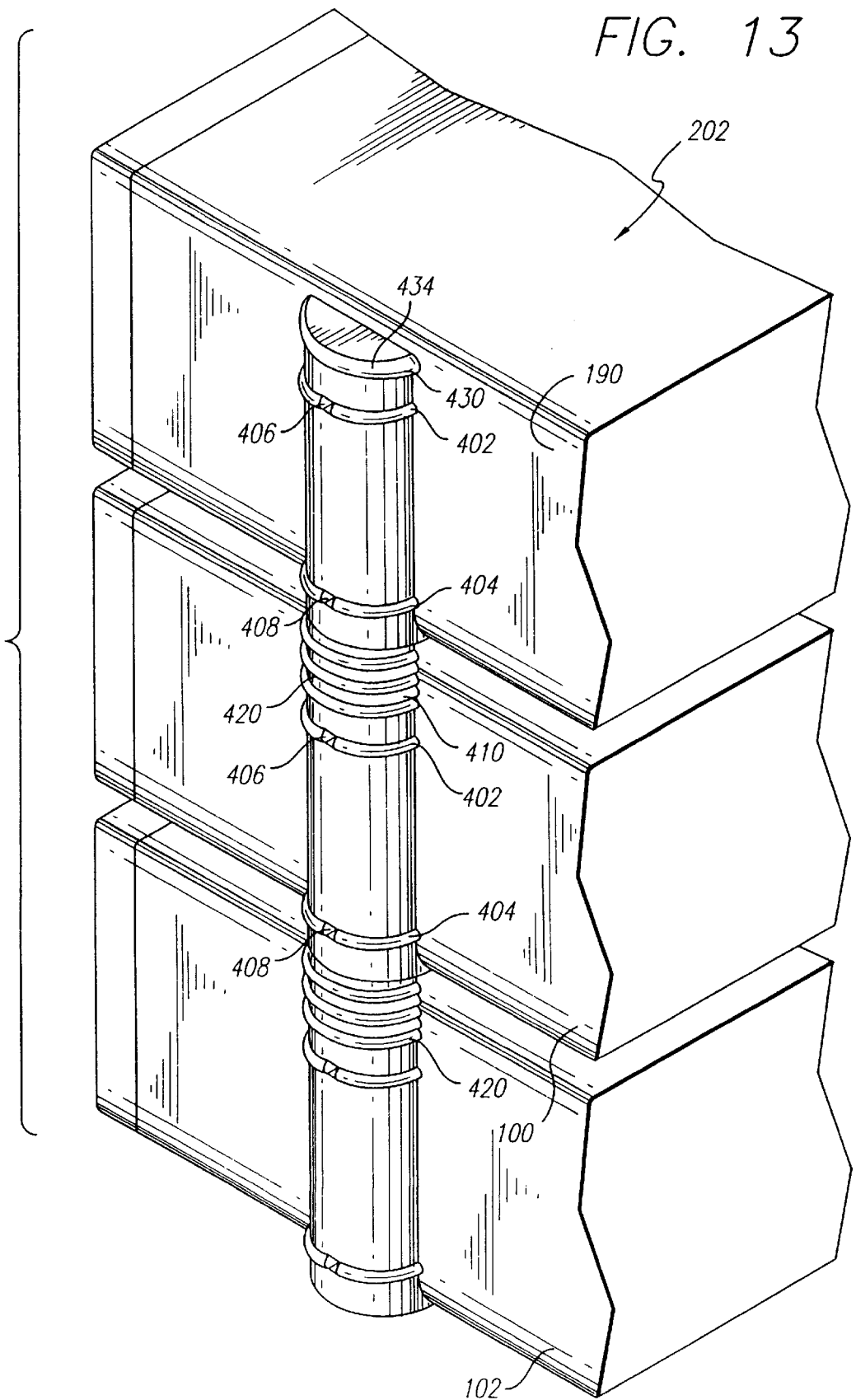

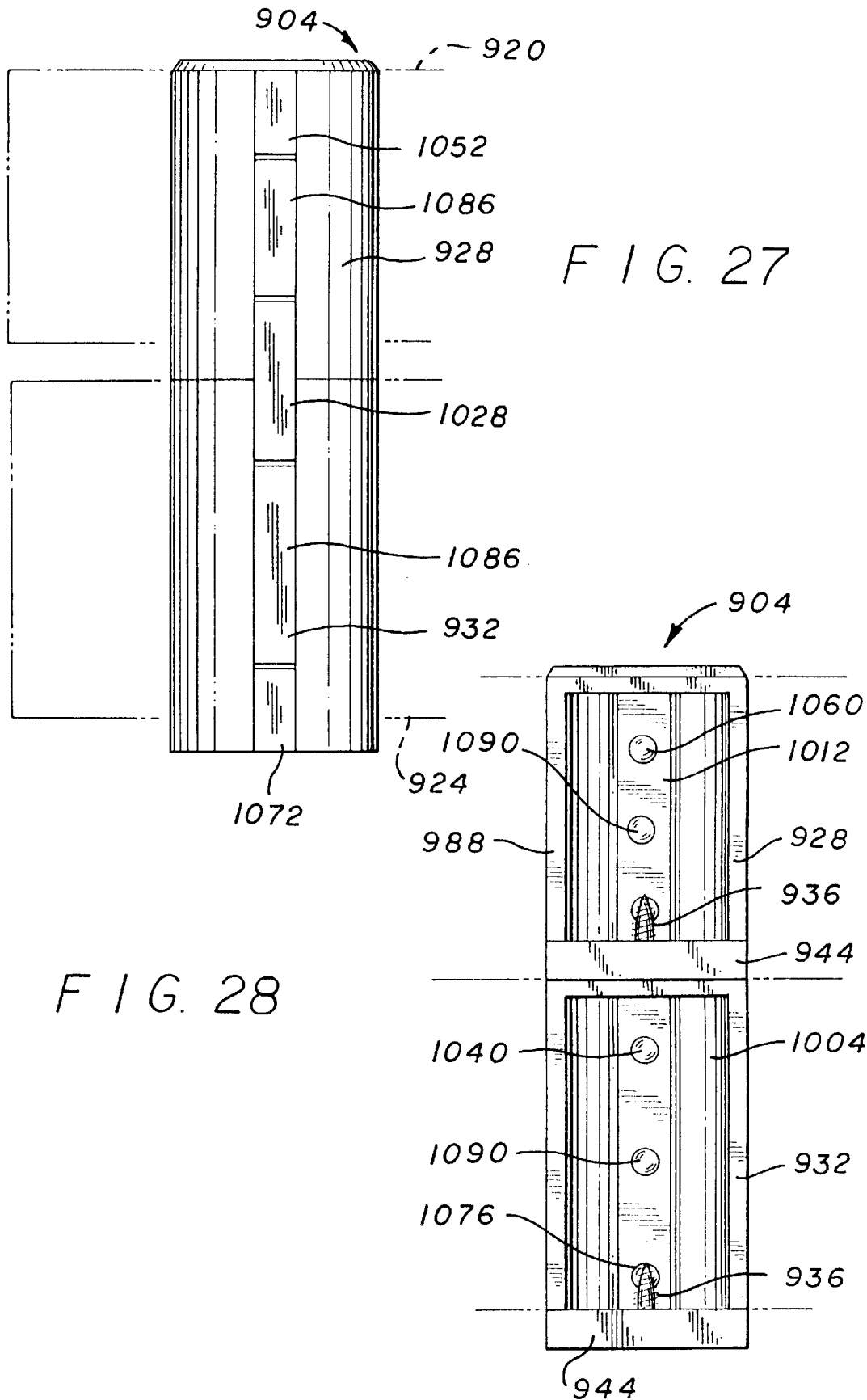

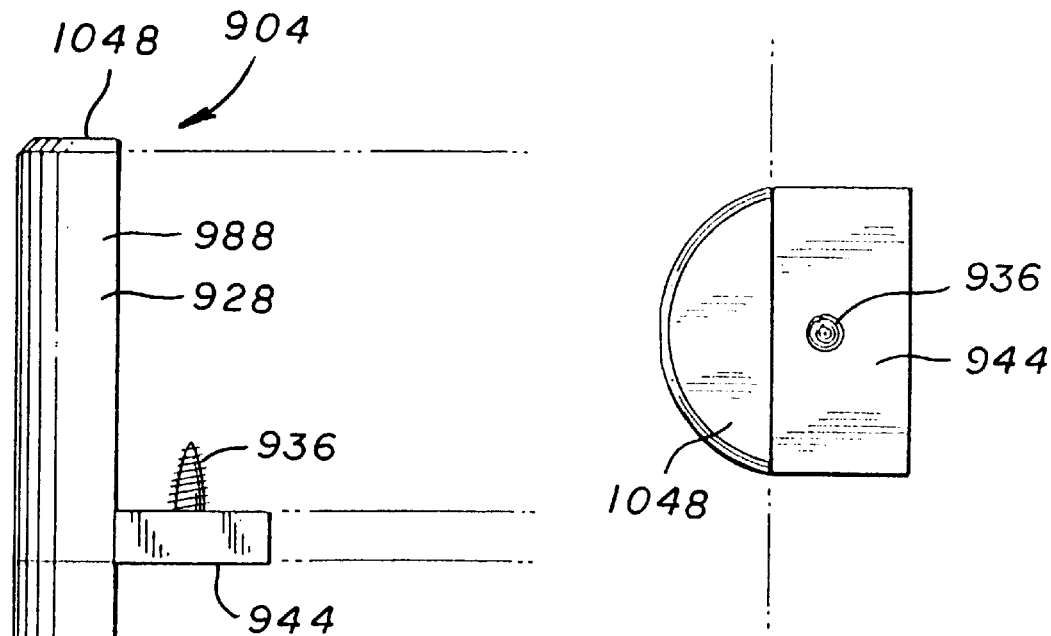
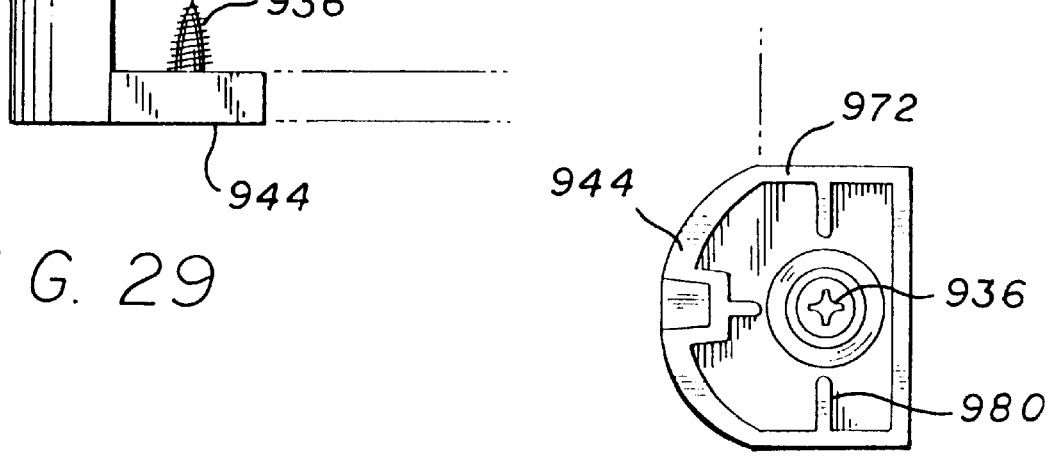
FIG. 29   FIG. 30   FIG. 31

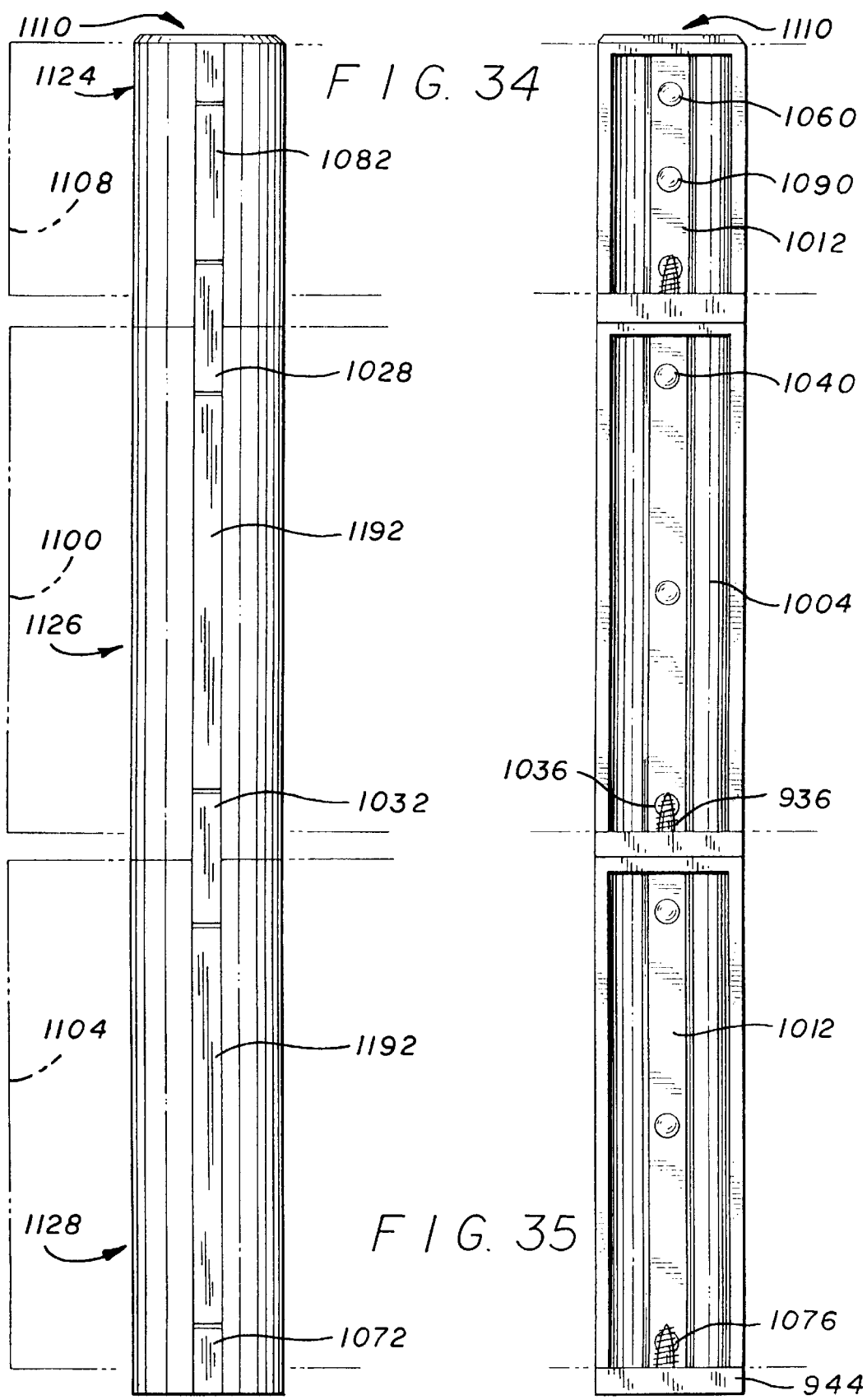

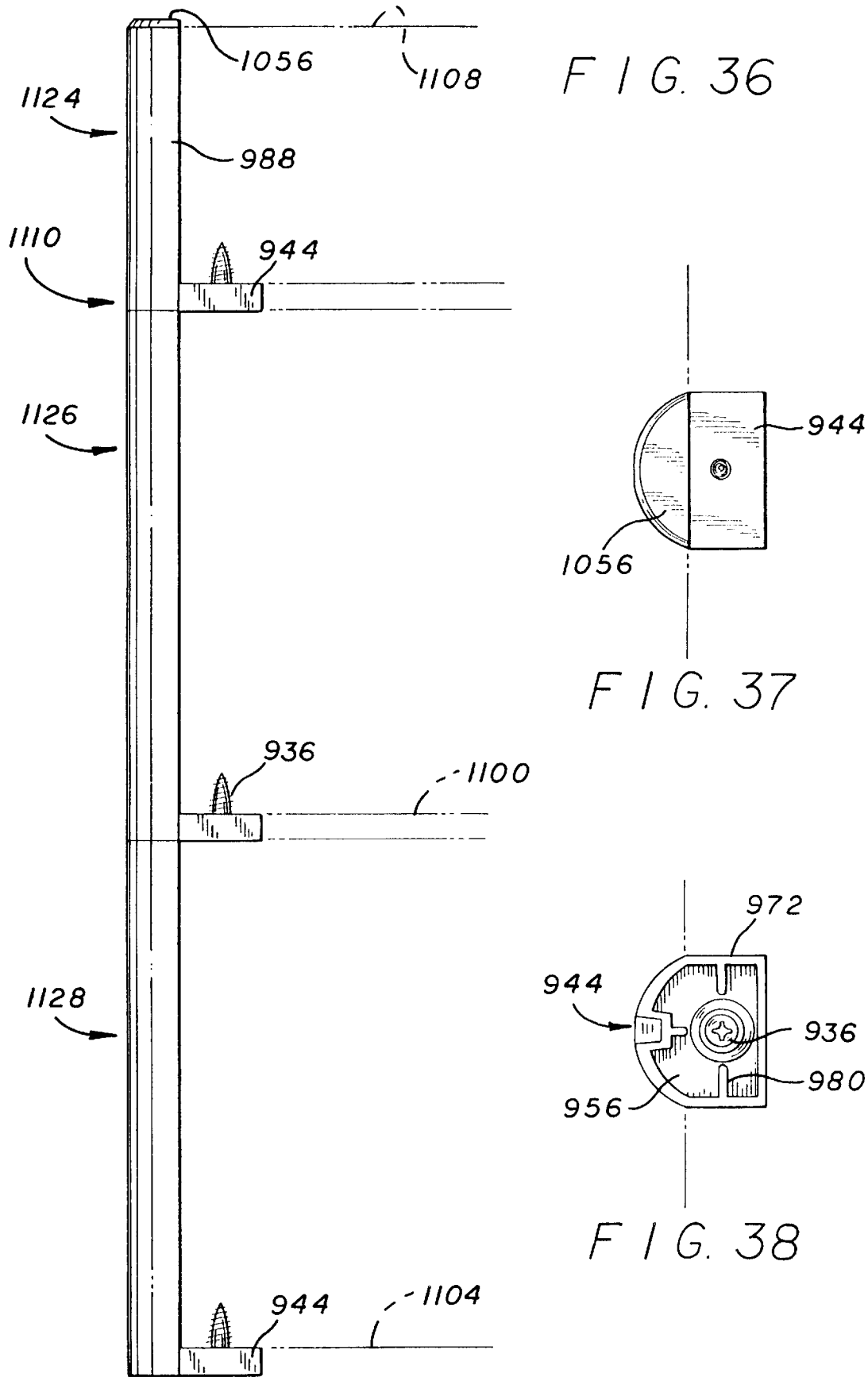

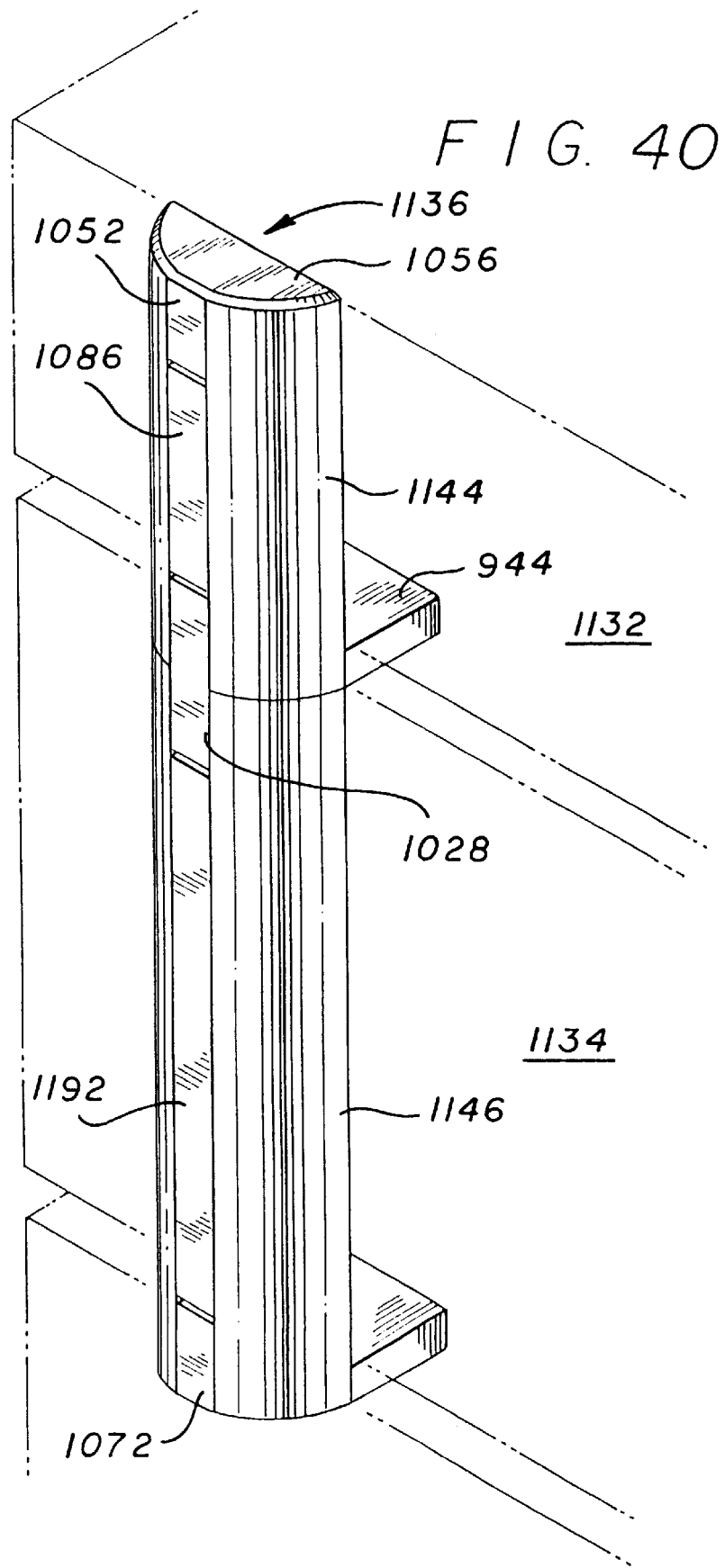

ADJUSTABLE INTERLOCKING SYSTEM FOR COMPUTER PERIPHERAL AND OTHER DESKTOP ENCLOSURES

CROSS-REFERENCE TO RELATED APPLICATIONS

This is a continuation-in-part of U.S. patent application Ser. No. 08/613,260, filed Mar. 8, 1996, now U.S. Pat. No. 5,788,347, U.S. patent application Ser. No. 29/051,460, filed Mar. 8, 1996, now U.S. Pat. No. D387,969, and U.S. patent application Ser. No. 29/071,247, filed May 23, 1997.

BACKGROUND OF THE INVENTION

The present invention relates to systems for interlocking computer peripheral modules or the like together in various horizontal and/or vertical stacking arrangements.

Computer systems today, both in the home and office, typically include numerous storage or other peripheral devices, such as CD ROMs, floppy disks, magnetic optical disk drives, and tape back-up systems, to be connected by wires or otherwise operated in conjunction with a computer (personal or Macintosh). It is important to organize and arrange these devices to be in efficient close proximity to one another, to minimize the horizontal as well as vertical space (the footprint) which they occupy, and to connect them together in the desired arrangement securely to prevent them from falling off of one another and/or off of desk or table tops. Unfortunately, the interlocking systems of the prior art do not provide for easy flexible use, easy locking and unlocking, and an attractive appearance.

SUMMARY OF THE INVENTION

Directed to remedying the problems in the prior art, an improved interlocking assembly, particularly adapted for interconnecting or mechanically locking together computer peripheral enclosures, is herein provided. The assembly includes according to one embodiment of this invention four L-shaped brackets connected to the bottom of a first enclosure or modular unit. Two of them extend with their back portions (parallel) up one side (or end) of the unit and the other two up the opposite side (or end). The feet of the brackets are screwed or otherwise secured to the bottom surfaces of the units.

Four similar brackets are similarly attached to a second unit. A first interlocking device is snap fit at one end to one of the back portions of the first unit and the opposite end to one of the back portions of the second unit. A similar second interlocking device is snap fit into the corresponding back portions parallel thereto of the two units. Thereby the first and second units are securely held together in side-by-side or one on top of the other arrangements. Inserting narrow tools into openings in the brackets releases the snap fit interlock as desired, to disconnect the units.

Instead of locking two units together, the interlocking devices can be configured and connected together as a carrying handle for one of the units, as a cable handler for the unit, or as an angled base for the unit. Different external surface configurations of the back portions, the body portions of the interlocking devices, the top trim caps and the bottom foot pads allow for various attractive system designs, and also to enclose them to prevent dust or dirt from collecting therein.

Another preferred embodiment of the present invention embodies many of the principles of the previously-described embodiments but with improvements thereon. For example, instead of the connector device having a body portion with male plugs at both ends, it comprises a connector bar with two spaced male members or posts projecting perpendicularly or laterally out therefrom, and not longitudinally therealong. This allows the L-shaped brackets when secured together with the connector device to be closer to one another. It also provides different and improved stressing on the male members (or posts) when the computer peripheral units are subjected to a separating force. The connector devices and other top cap, center, and bottom foot members also fit into vertical or longitudinal slots on the brackets to provide an additional snap-fit attachment of the members. With outer surfaces of the members shaped to conform to the curvature of the outer face of the brackets when snap fit into the slots, an aesthetically appealing product is also thereby provided.

The four brackets are attached with screws to the unit (computer peripheral and other desktop enclosures), two spaced on one side and two spaced on the opposite side. For each of the brackets, a top cap member is snapped into the top hole in the bracket and the top portion of the slot, a bottom member is snapped into the bottom hole in the bracket and the bottom portion of the slot, and an elongate center member of the correct length is snapped into a center hole in the bracket and the central portion of the slot. Similar brackets, top caps, etc. are attached to the other units. Different sizes or heights of brackets and center members of different lengths (or heights) are provided to accommodate units of different heights.

When it is desired to stack and connect the units, the top caps of the bottom unit and the bottom members of the top unit are unsnapped and removed. They can be unsnapped by simply pulling (with the user's fingers) at the ends of the members, without any tools needed. The units and their corresponding brackets are aligned and the connector members are attached with their top posts in the bottom holes in the brackets of the top units and the bottom posts in the top holes in the brackets of the bottom units.

The top cap devices, center members, bottom members, and connector members can be provided in one color and the brackets in another color to form an attractive stacking assembly, and to also assist in disassembly (and assembly) by providing a readily-apparent visual difference between the attachment components and the brackets. Further, these components can be provided or sold to the user totally or partially disassembled or loose in a kit form, for example, in a transparent plastic bag together with an assembly instruction sheet.

Other objects and advantages of the present invention will become more apparent to those persons having ordinary skill in the art to which the present invention pertains from the foregoing description taken in conjunction with the accompanying drawings.

BRIEF DESCRIPTION OF THE DRAWINGS

FIG. 2 is an enlarged rear perspective view of an L-shaped bracket similar to that of FIG. 1, shown in isolation;

FIG. 3 is an enlarged perspective view of an interlocking connector similar to that of FIG. 1, shown in isolation;

FIG. 4 is an alternative embodiment of the bracket of FIG. 2;

FIG. 5 is an alternative embodiment of the interlocking connector of FIG. 2;

FIG. 10 is an enlarged exploded perspective view showing a trim cap for the top of the bracket;

FIG. 11 is an end view of the cap of FIG. 10;

FIG. 12 is a bottom view of the cap;

FIG. 13 is a view similar to FIG. 9 showing a further embodiment;

FIG. 27 is a front elevational view of the assembly of FIG. 26;

FIG. 28 is a rear elevational view thereof;

FIG. 29 is a side elevational view thereof;

FIG. 30 is a top plan view thereof;

FIG. 31 is a bottom plan view thereof;

FIG. 32 is a partially exploded, top perspective view of yet another alternative interconnecting system shown in use with four interconnecting assemblies;

FIG. 34 is a front elevational view thereof;

Figure 24:
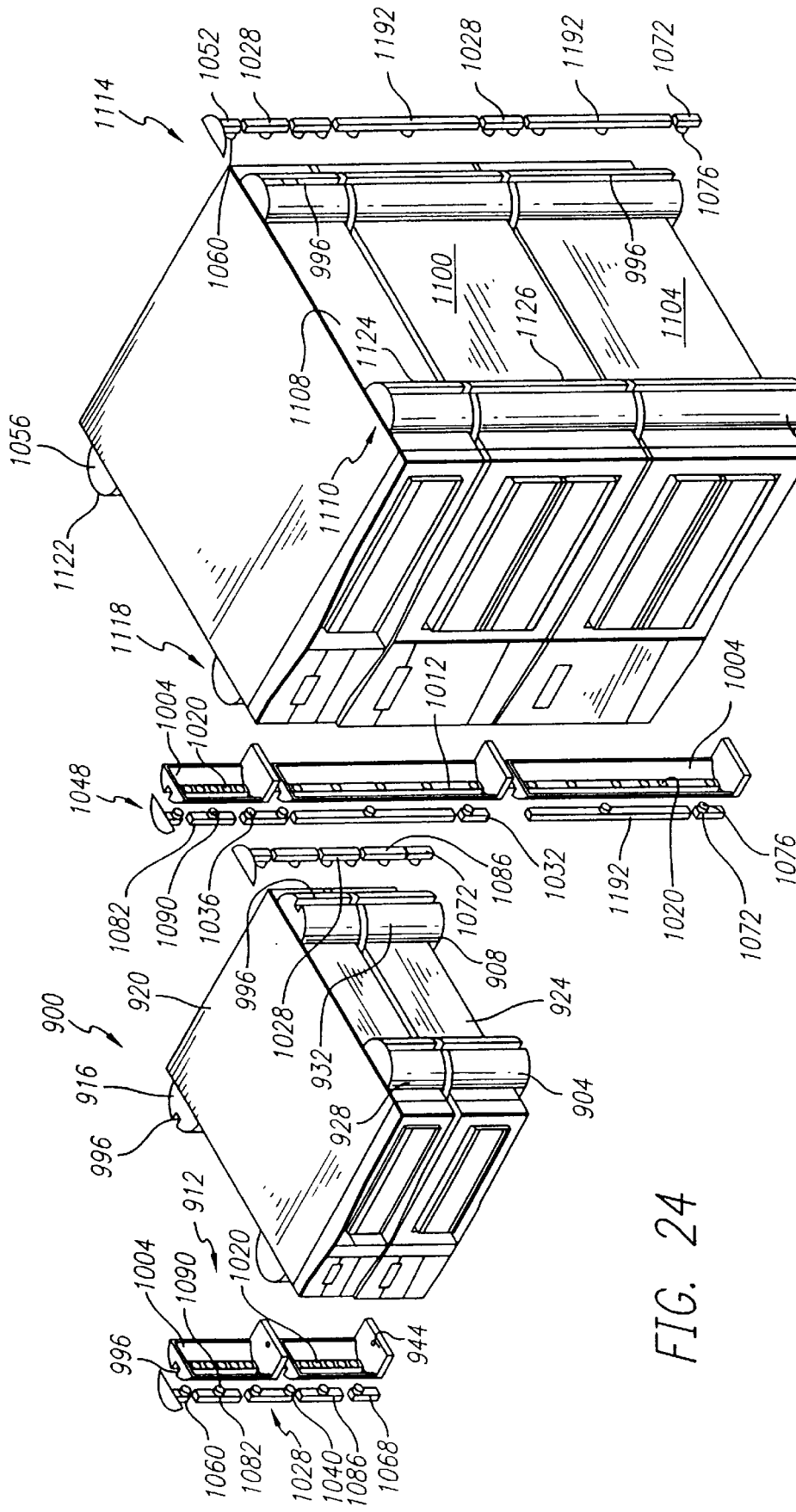
FIG. 24 is a partially exploded, top perspective view of another alternative interconnecting system shown in use with four interconnecting assemblies.
Figure 39:
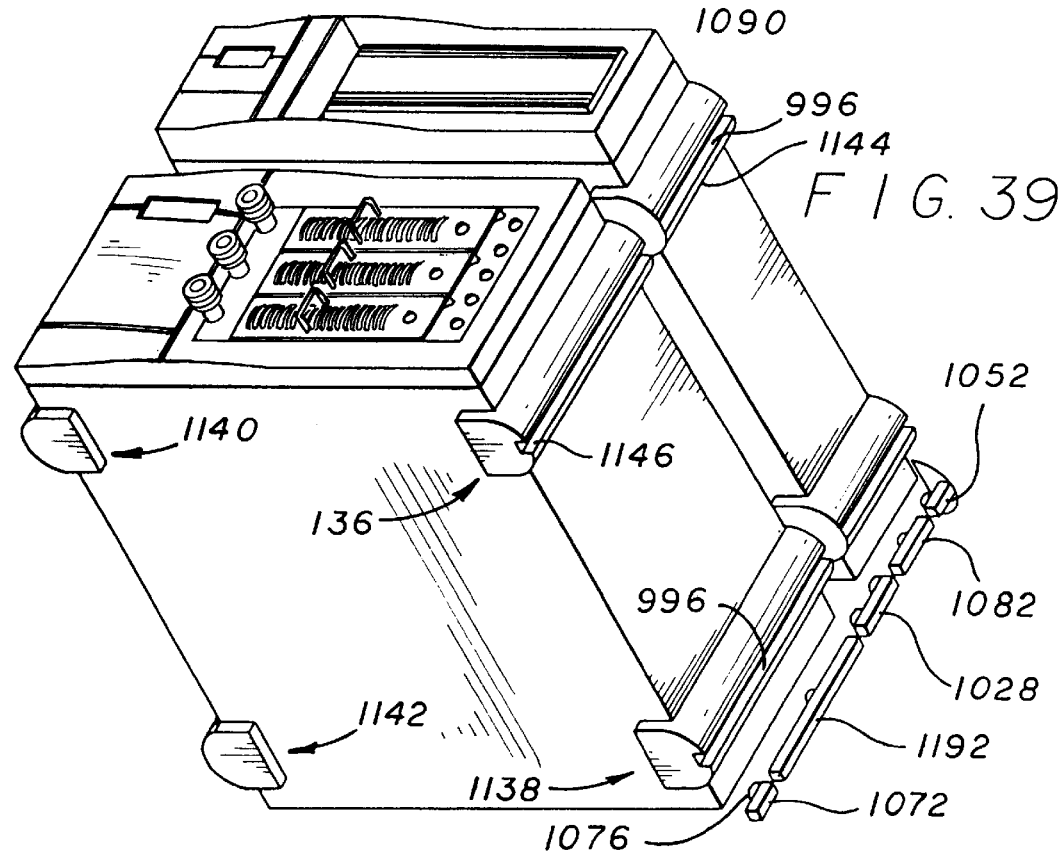
Figure 26:
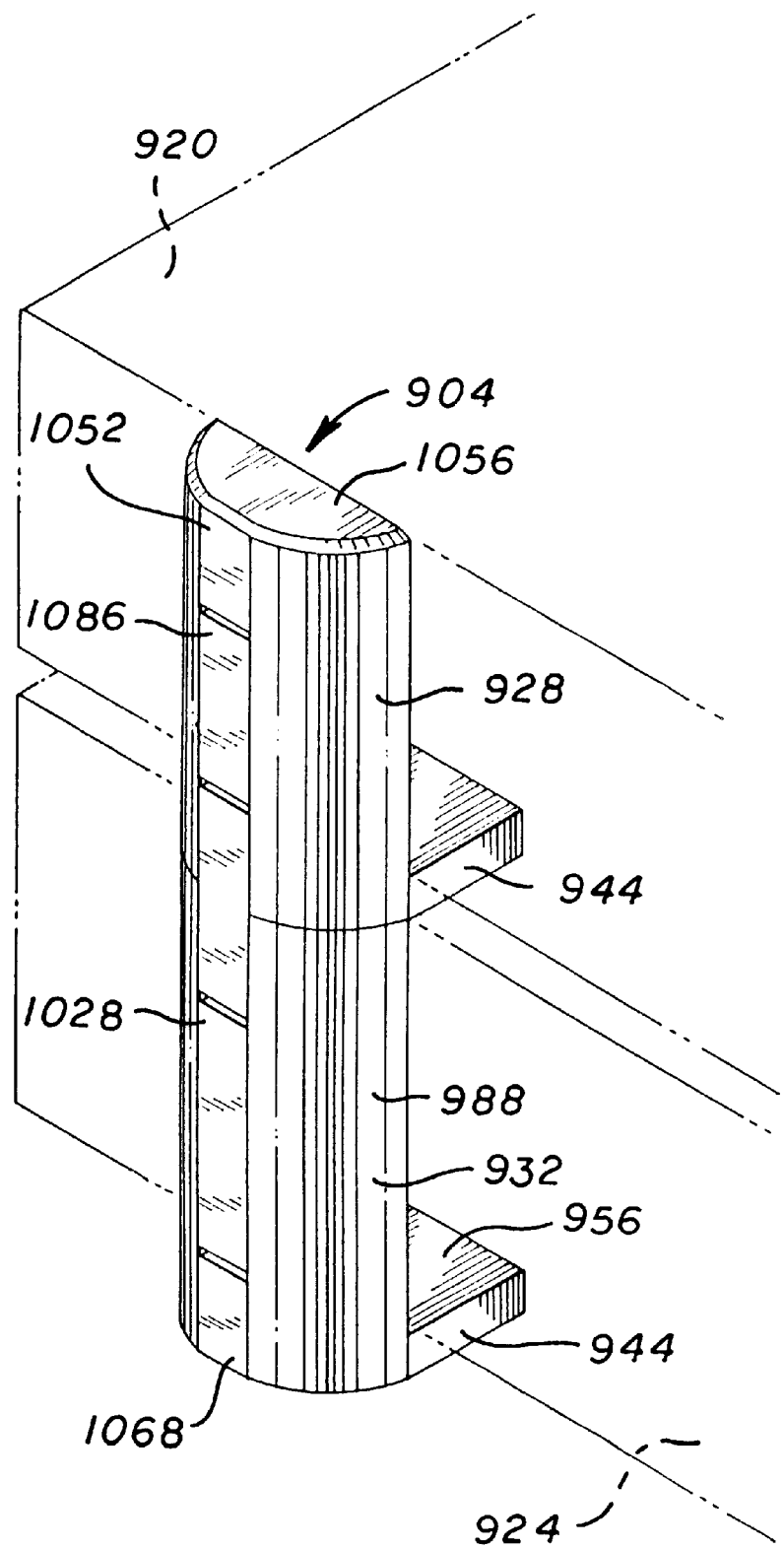
FIG. 26 is an enlarged perspective view of one of the interconnecting assemblies of the system of FIG. 24 and illustrated in isolation.
Figure 33:
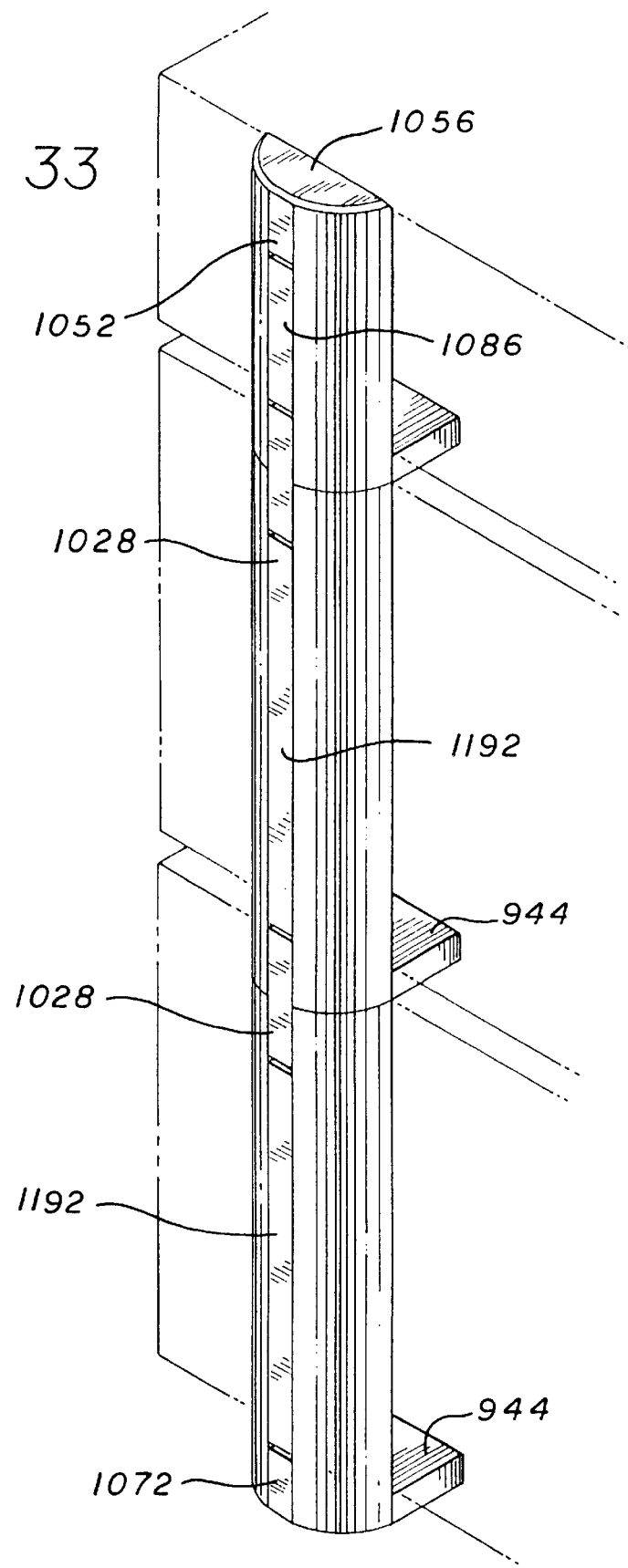
FIG. 33 is an enlarged perspective view of one of the interconnecting assemblies of the system of FIG. 32 and illustrated in isolation.
Figure 41:
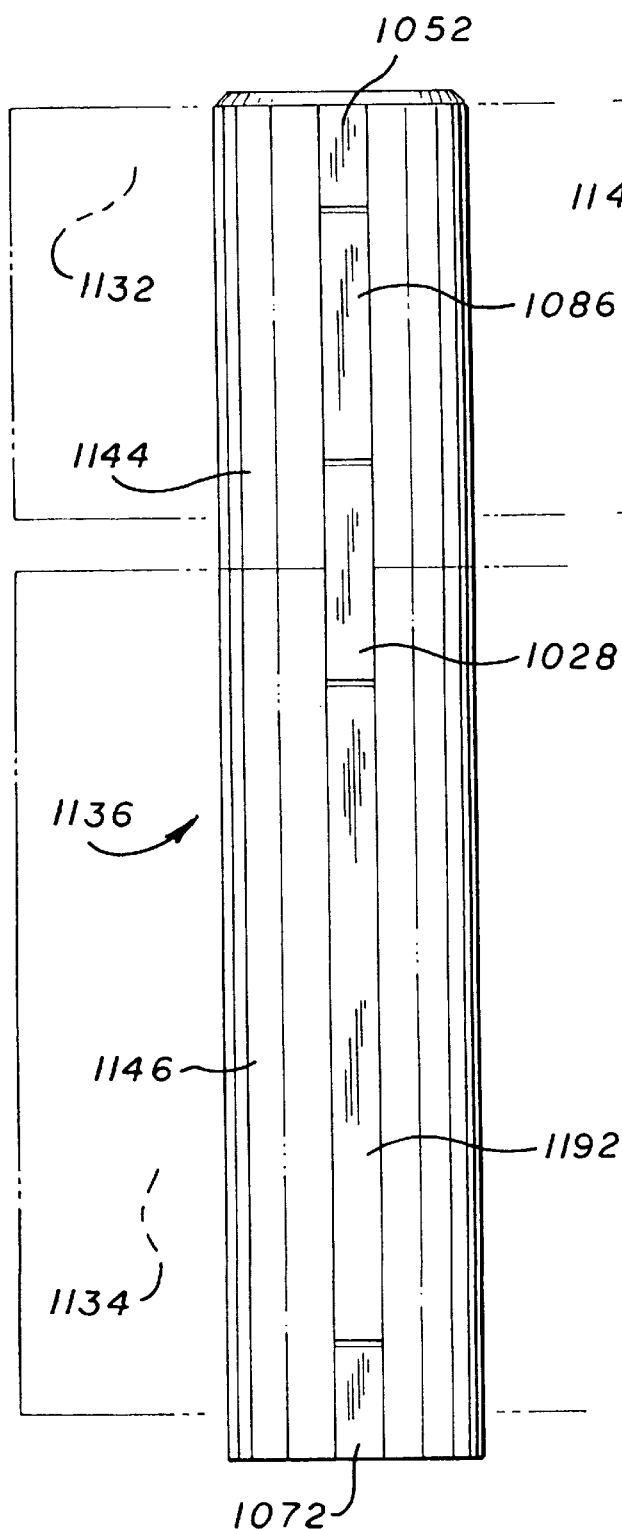
Figure 42:
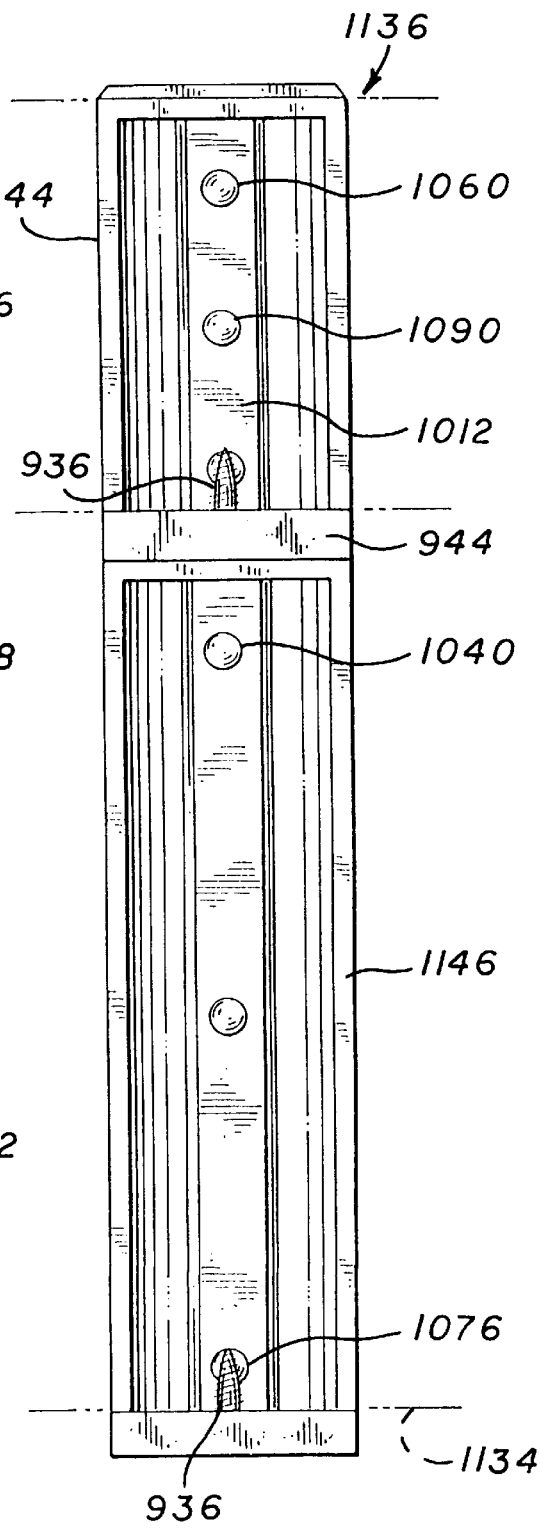
Figure 43:
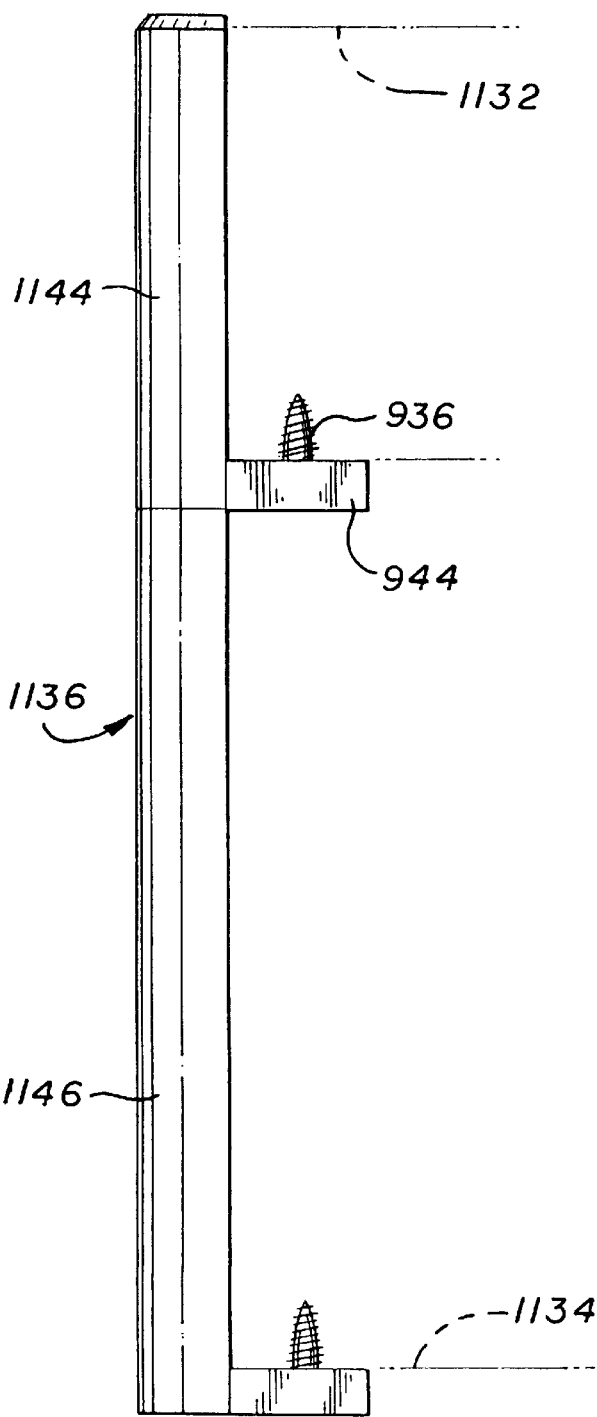
Figure 44:
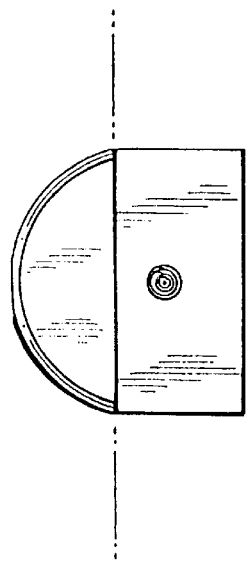
Figure 45:
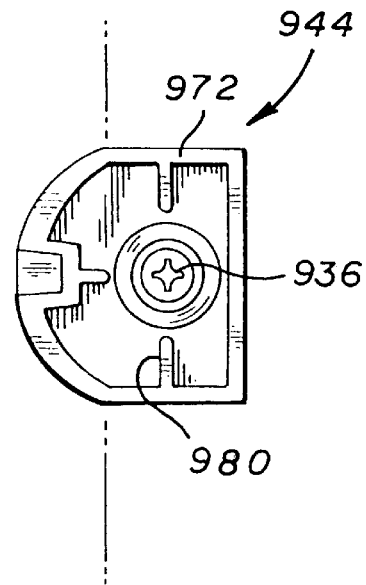
Figure 46:
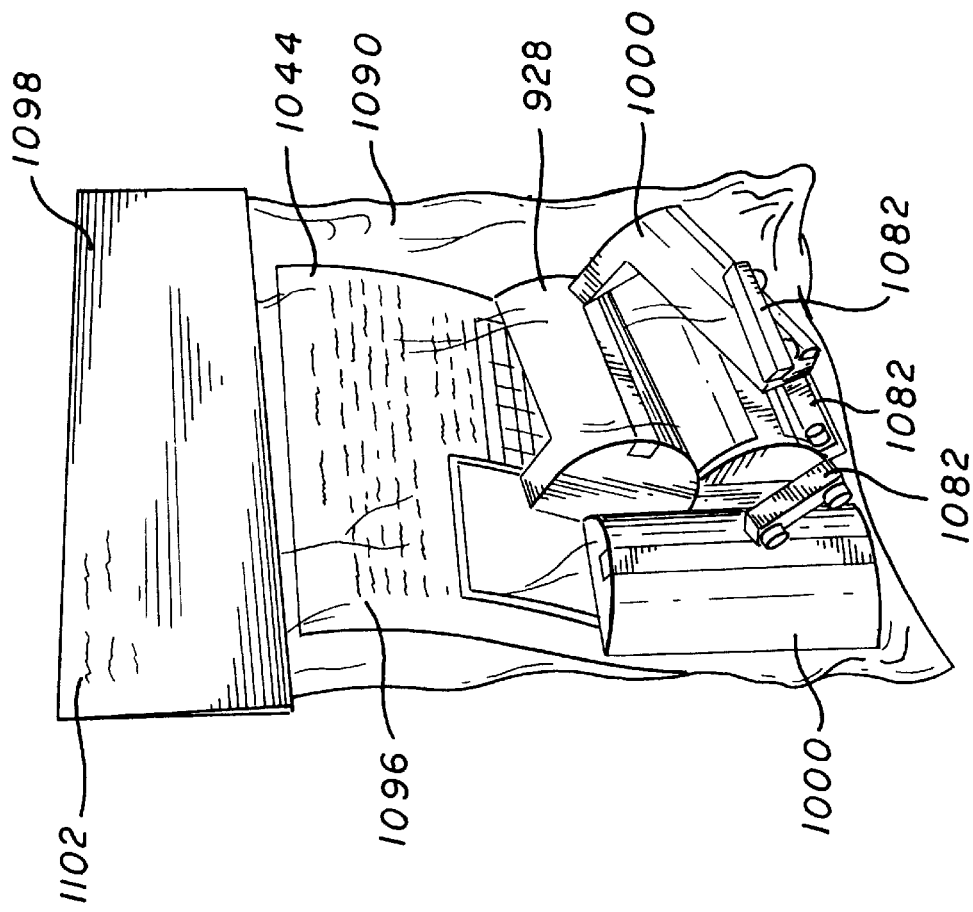
Figure 47:
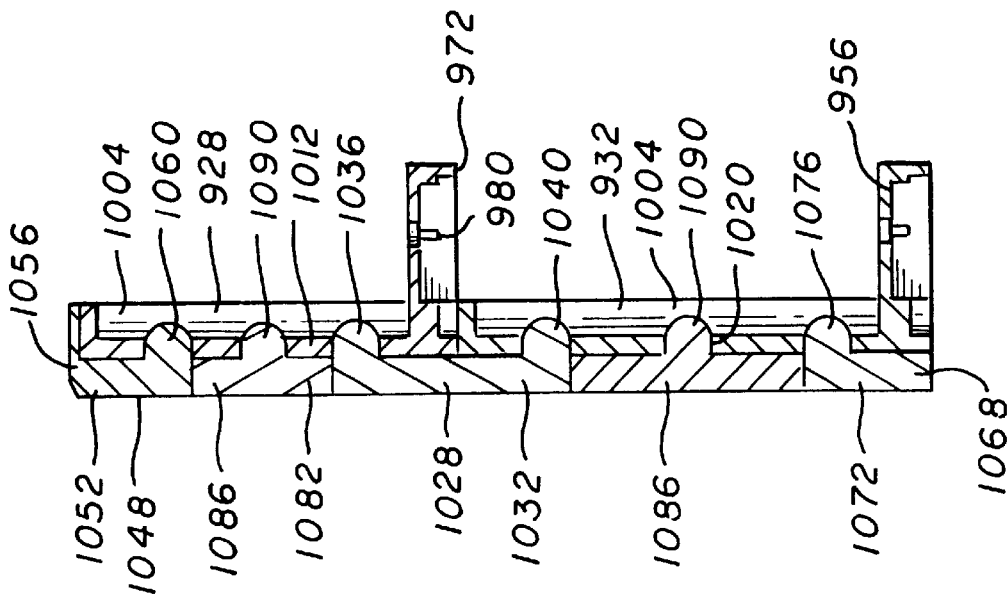

F1G. 35 is a rear elevational view thereof;

FIG. 36 is a side elevational view thereof;

FIG. 37 is a top plan view thereof;

FIG. 38 is a bottom plan view thereof;

FIG. 39 is a bottom perspective view of yet another interconnecting system, shown in use with four interconnecting assemblies;

FIG. 40 is an enlarged perspective view of one of the interconnecting assemblies of the system of FIG. 39 and illustrated in isolation;

FIG. 41 is a front elevational view thereof;

FIG. 42 is a rear elevational view thereof;

FIG. 43 is a side elevational view thereof;

FIG. 44 is a top plan view thereof;

FIG. 45 is a bottom plan view thereof;

FIG. 46 is an enlarged cross-sectional view through one of the assembled interconnecting assemblies of FIG. 24; and FIG. 47 is a front perspective view of assembly components of the systems of FIGS. 24 or 32, for example, shown in a retail package together with an assembly instruction sheet.

DETAILED DESCRIPTION OF PREFERRED EMBODIMENTS OF THE INVENTION

Figure 1:
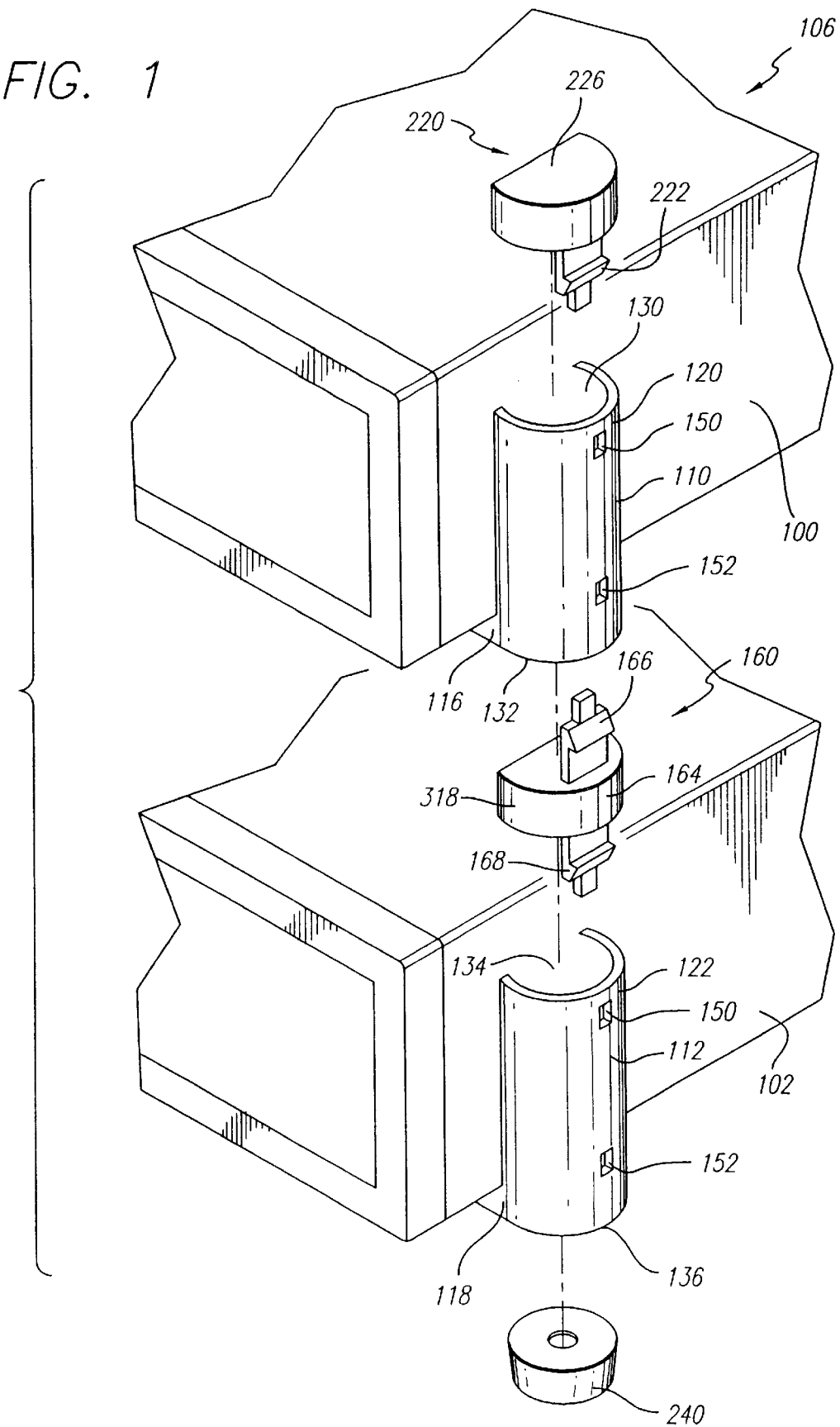
FIG. 1 is an exploded perspective view of an interconnecting assembly of the present invention.
Figure 6:
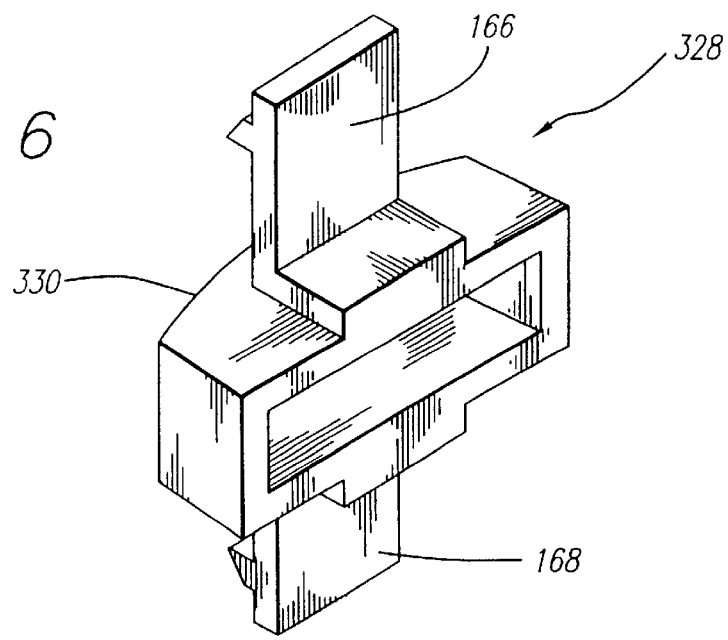
FIG. 6 is a rear perspective view of an interlocking connector, similar to that of FIG. 5.

Referring to the drawings, numerous embodiments of the present invention are illustrated and a basic form of the invention is shown in FIG. 1. It is seen that there are first and second units 100, 102, which can be housings or other enclosures and can include storage or other peripheral devices, such as CD ROM drives, floppy disks, magnetic optical disk drives, and tape backup systems. An interlocking assembly of the present invention illustrated generally at 106 interlocks or mechanically connects the two units 100, 102. The assembly 106 includes first and second L-shaped brackets 110, 112, each screwed (or otherwise secured) onto the bottoms of the respective units 100, 102, as will be described in detail later. Each bracket 110, 112 has a generally horizontal foot portion 116, 118 and a generally vertical back portion 120, 122; the respective portions are integrally formed together as L-shapes.

The back portions 120, 122 have respective openings 130, 132, 134, 136 at the top and bottom ends thereof. In the interior of the back portions 120 (122) as shown in FIGS. 2 and 4, for example, are upper and lower ribs, ridges, or stop members 140, 142. And adjacent to these ridges 140, 142 on the opposite sides of the respective end openings are small front or side access through-openings 150, 152, whose purpose will become apparent with the later discussion of FIG. 8.

The assembly further includes an interlocking device shown generally in the center of FIG. 1 at 160. This device 160 has a body portion 164, a first hook-type lock 166 extending from the top of the body portion and a second hook-type lock 168 extending from the bottom of the body portion. The first or top hook lock 166 is snapped in through the bottom opening 132 of the first L-shaped bracket 110 such that the hook latches onto the bottom ridge (142) therein. Similarly, the second or bottom hook lock 168 fits into the top opening 134 of the back portion and snaps onto the top ridge (140) therein. Thereby, the first and second L-shaped brackets 110, 112 and thus the first and second units 100, 102 are releasably attached together. Also, as will become more apparent from subsequent drawings, the body portion 164 has a unique shape to coordinate with the outer shapes of the first and second back portions 120, 122.

A second interlocking device 180 (not shown in FIG. 1) can also be provided to snap into the top opening 130 of the first bracket 110 such that a third unit (190) (also not shown in FIG. 1) can be snap fit on top of the first unit 160. In other words, the units would be stacked three high. Three unit high stacking arrangements are shown, for example, in FIGS. 9 and 13–16 generally, at 200, 202, 204, 206, 208, respectively. Additional units can be stacked on top or below these units by simply providing additional interlocking devices with each of the units having their respective L-shaped devices attached thereto as would be apparent to those skilled in the art from this disclosure.

With the desired number of units stacked and interlocked, a trim cap 220 can be snap fit onto the top of the L-shaped bracket 110 of the uppermost unit (e.g., 100 or 190) down into the top opening 130 of the back portion 120 thereof, as shown in FIG. 1. This trim cap 220 can have a similar hook lock 222 to hook onto the upper ridge in that L-shaped bracket 110. The trim cap 220 also can have a top hat or cap portion 226 providing a simple attractive closure for the unit.

Similarly, at the bottom of the system 106 a foot pad 240 can be inserted into the bottom opening 136 of the lowermost L-shaped bracket 112. The foot pad 240 need not (although it can) have a hook-type lock, but rather can be made of an elastic material so that it can be press fit into the bottom opening 136. In fact, it is preferable that the foot pad 240 have an elastic type construction with smooth corners so as not to mar or scratch any surfaces on which it may rest or impact.

Figure 7:
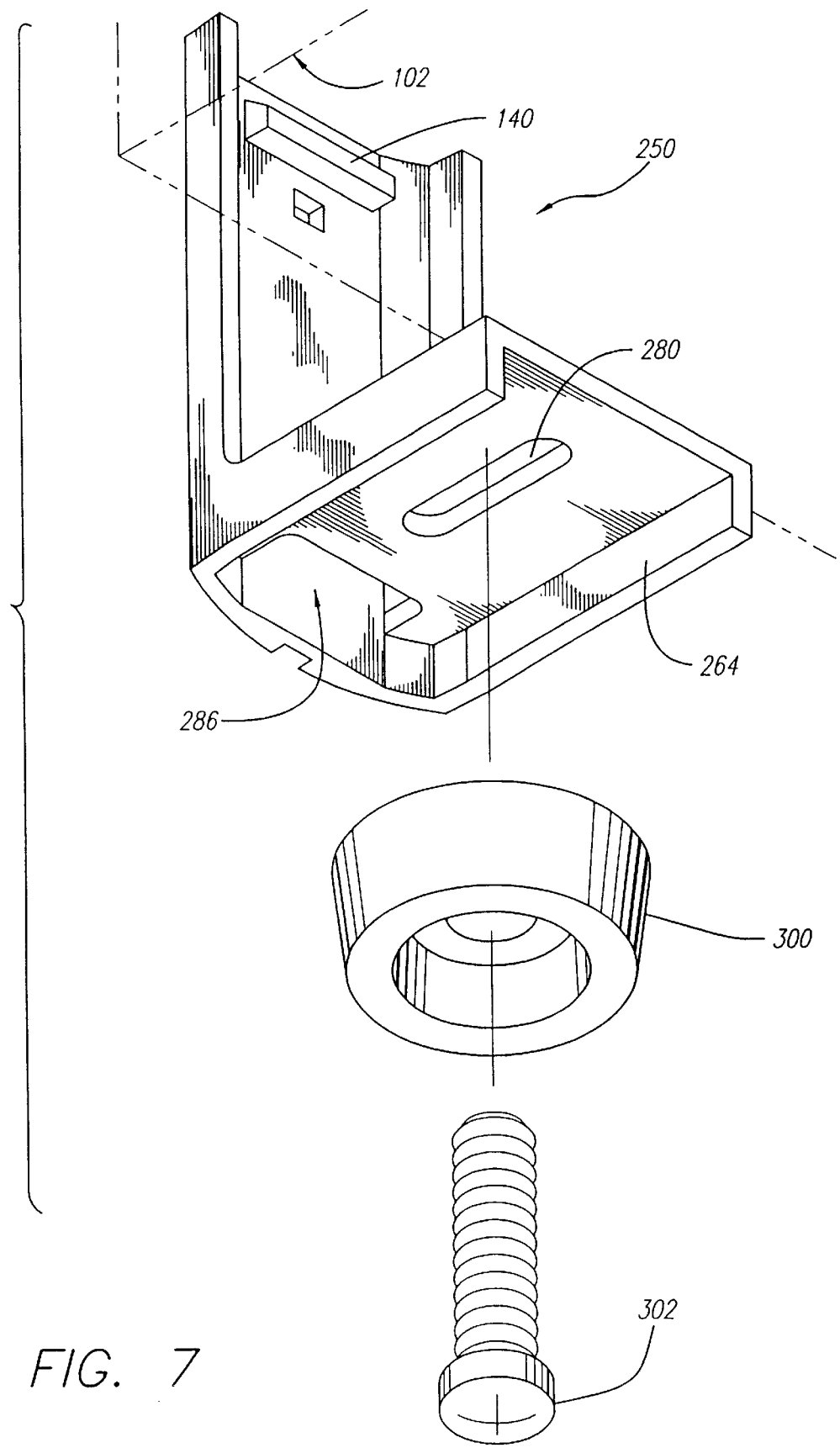
FIG. 7 is an enlarged, exploded bottom perspective view showing the attachment of a bracket (such as that of FIGS. 1, 2 or 4) to an enclosure.

FIGS. 2 and 4 show in greater detail the constructions of variations of the L-shaped brackets 250, 260. It is seen therein that they both include the foot and back portions 264, 266, 268, 270. The back portions 266, 270 have a cylindrical or similar type shape and define top openings 274, 276, respectively. Similarly, bottom openings 286, 288 are defined at the bottom ends of the back portions 266, 270 through the respective foot portions 264, 268. The ribs or ridges 140, 142 are molded or otherwise secured to the inner surface of the back portions 266, 270, and the access openings 150, 152 are formed adjacent thereto. The foot portions 264, 268 have U-shapes with slots 280, 282 through the top surface such that the flange sides 290, 294 of the U-shapes define a holder or region for a nut 300. This nut 300 fits into the U-shape as best shown in FIG. 7, with a screw 302 or other connector passing up through the nut through the slot 280 and into a corresponding foot opening 308 as typically is already provided in these types of (computer peripheral) units.

The L-shaped brackets (e.g., 110) as well as the interlocking devices 160 can be economically molded with a durable plastic into the desired shape. The hook or snap locks 166, 168 at the ends of the connector devices 160 have a resilience to them so that when they are pushed down into the openings 130, 132, etc., at the ends of the bracket members 110, etc., they will deflect a small amount. The hooks or ridges 140 will thereby snap over the ridges of the interior of the bracket portions snapping into place with a resilient hook snap arrangement.

Figure 8:
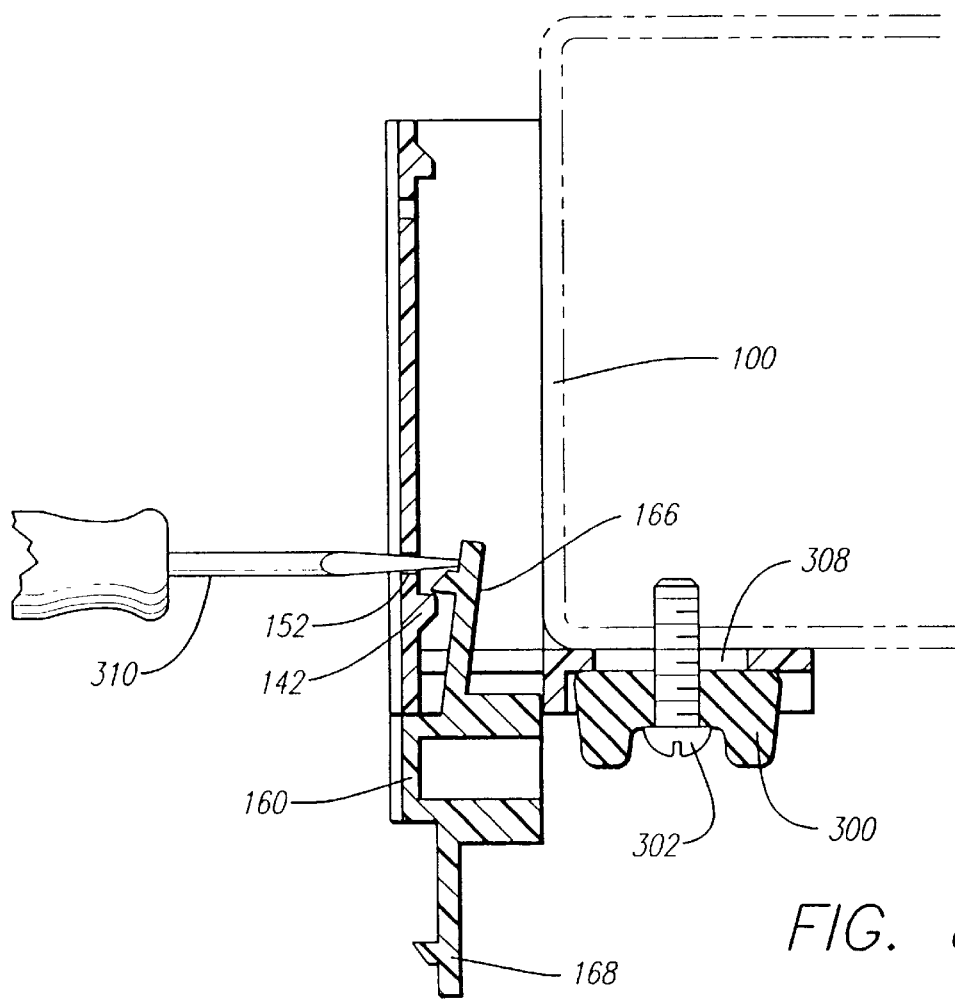
FIG. 8 is a cross-sectional view showing a procedure for releasing an interlocking connector from a bracket of the invention.

Disconnecting the connector devices 160 from the L-shaped brackets 110 is an easy process, as can be understood from FIG. 8. An elongate pointed tool, such as a screwdriver 310, is inserted into the access through-opening in the face of the bracket so that it engages the extension of the hook. And with a slight amount of pressure exerted thereagainst, the hook is pushed away from the ridge and out of engagement. The interlocking device 160 can then simply be pulled out and away of the top or bottom openings of the back portion.

Various configurations of the outer surface of the back portion and the outer surface of the body portion of the connector device are possible to present various alternative attractive designs. One embodiment is to have a simple smooth curve as shown in FIG. 1, for example. Another is to have a less rounded, more elliptically shaped curve 318 to the back portion as shown in FIG. 2, with the body portion 320 of the connector device 322, as shown in FIG. 3, having a matching shape. The body portion can also have a decorative vertical slot 324 in the central portion thereof.

A similar slot 326 is also shown in the device 328 of FIG. 5. Shown therein is a slightly different shape of the outer surface of the body portion 330 wherein the outer edges 332 are flat and the central portion 334 is more rounded. The corresponding back portion of the L-shaped bracket, as shown in FIG. 4, has a similar shape with a slot 336 and side straight flat surfaces 344 and the rounded middle portion 346. These vertical slots 326, 336 do not pass all the way through the back portions of the L-shaped brackets or the body portion of the connector device such as to divide them in half or form a through-slit. Rather, they just penetrate or extend a slight distance to form a decorative configuration.

Figure 9:
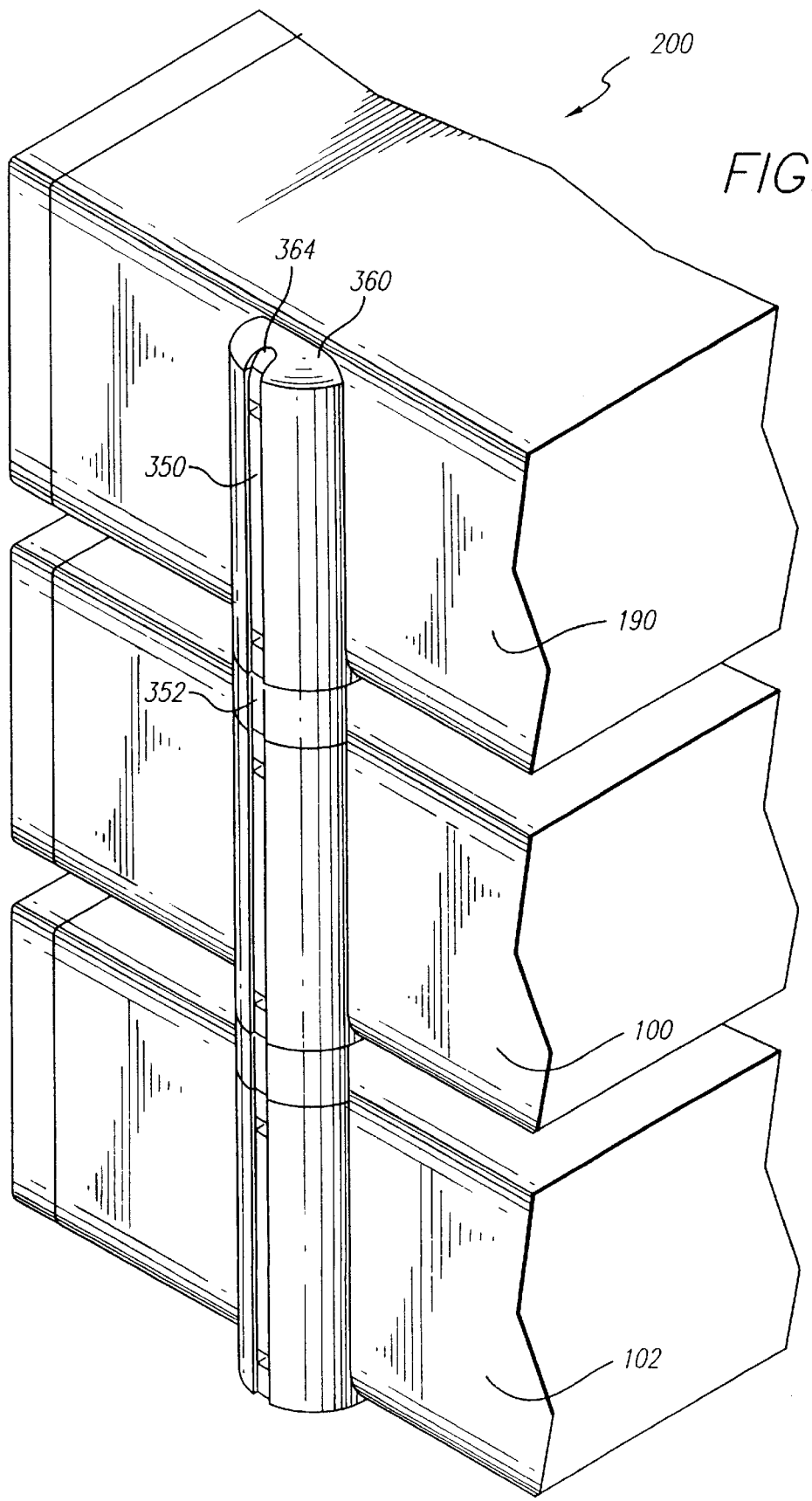
FIG. 9 is a perspective view of an alternative interconnecting assembly shown in use.

FIG. 9 shows at 200 a configuration where the portions of the connector device and the back portions of the L-shaped brackets are each rounded, and each has a vertical slot 350, 352. The trim cap 360 has a rounded, almost spherical shape with a small rounded slot 364 at the center thereof aligned and conjoining with the slots 350 of the adjacent back portion 378. FIGS. 10–12 show a variation thereof with the small slot 368 at the center base of the trim cap 370 aligned with the slot 376 in the adjacent back portion 378. This causes the trim cap 360 and the back portion 380 to resemble a continuous piece with the small slot portion 368 of the base of the cap 360 forming the top of the slot 376 of the back portion. This cap 360, unlike that of FIG. 9, has a generally flat and sloping top 380 and flat side edges 382 angling inward at a very slight angle as can be seen from FIG. 12, and a gently rounded central portion 384.

FIG. 13 shows at 202 a slightly more complex design with lateral ribs or protrusions 400 extending horizontally and spaced one from another. The back portion of the L-shaped bracket has two of these rounded exterior ribs 402, 404 with the access through-openings 406, 408 passing therethrough at opposite ends. It is seen that this same construction is provided for each of the three L-shaped brackets illustrated therein. The body portions of the connector devices 410 have a series of adjacent lateral ribs 420 forming a series of arcs or bumps when viewed in horizontal cross section. The trim cap 430 has a rib 434 at its top surface.

Figure 14:
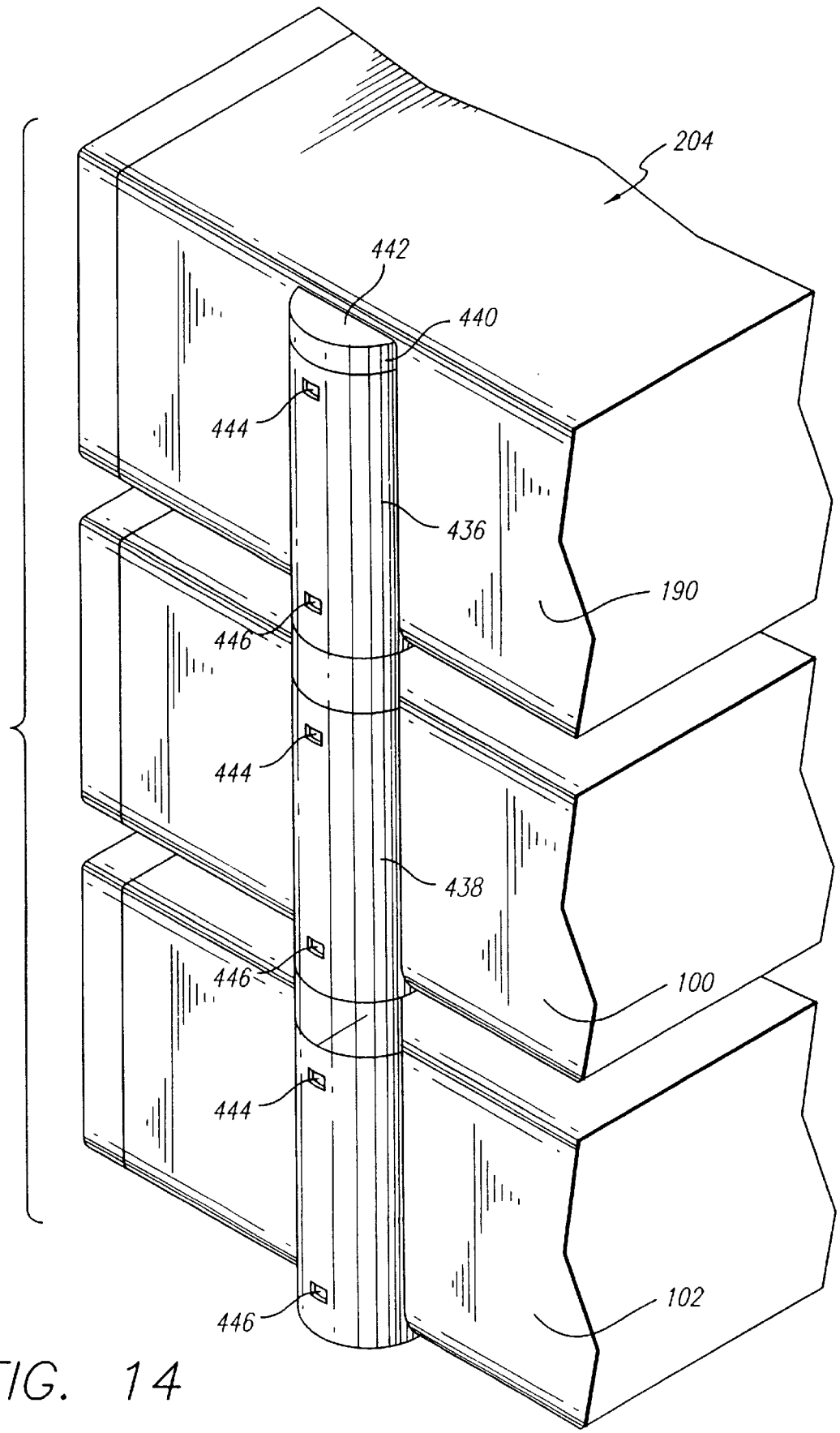
FIG. 14 shows a still further embodiment.
Figure 15:
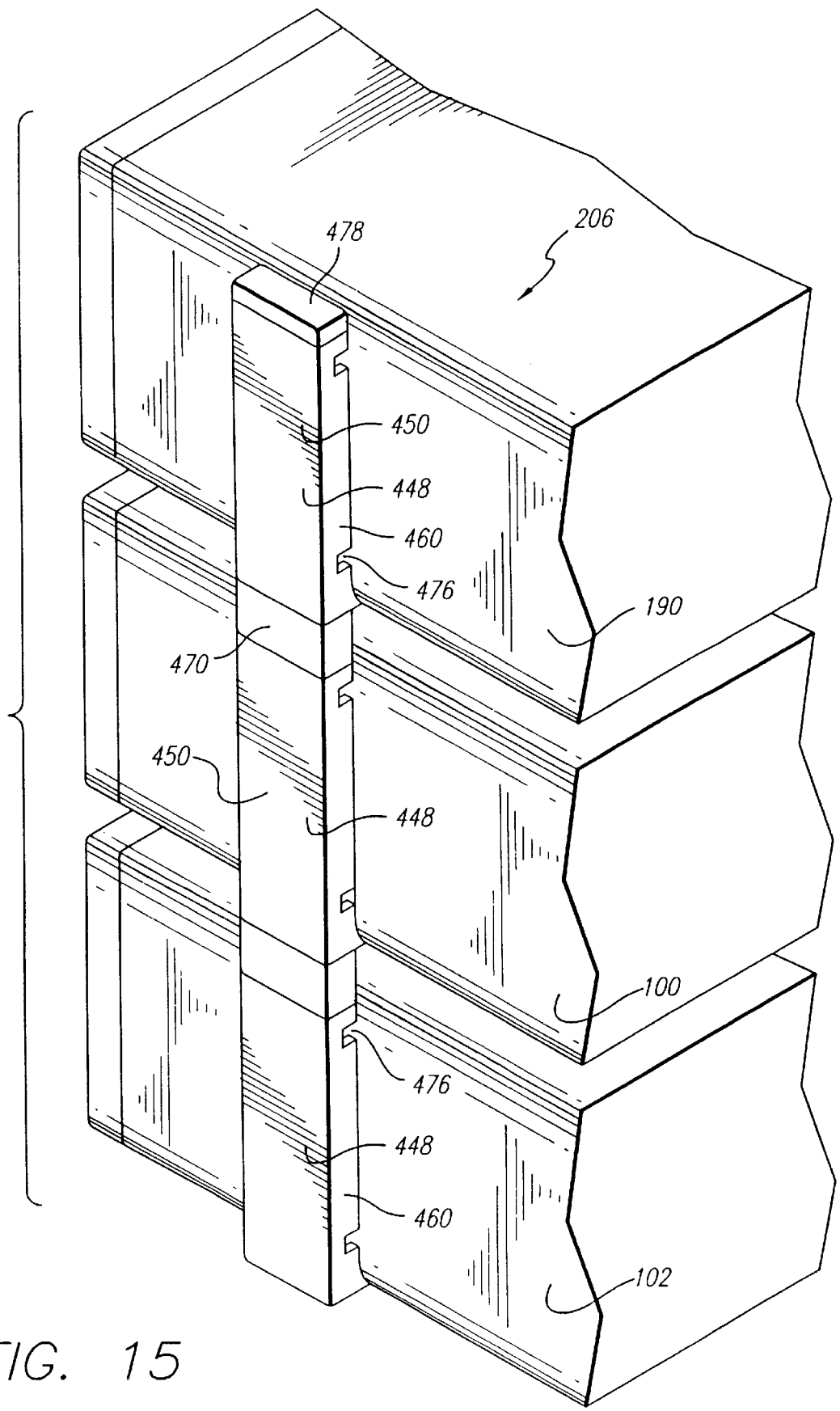
FIG. 15 shows an even still further embodiment.

FIG. 14 shows at 204 a simpler configuration with the back portions 436 and body portion being rounded with an almost semicircular shape and the trim cap 440 having the same curvature and a generally flat top 442. Suitable access through-openings 444, 446 are provided in the back portions 436. In contrast, FIG. 15 shows at 206 a rectangular or box-like configuration with the back portions 448 having a wide outward face 450 and a narrow (side) thickness 460 away from the units. The body portions of the connector devices 470 have a similar wide and narrow angled configuration. The disconnect openings 476, instead of being provided on the front face, are provided on the side edges. The trim cap 478 can have a slightly less angular, more rounded configuration than the brackets as shown in FIG. 15.

Figure 16:
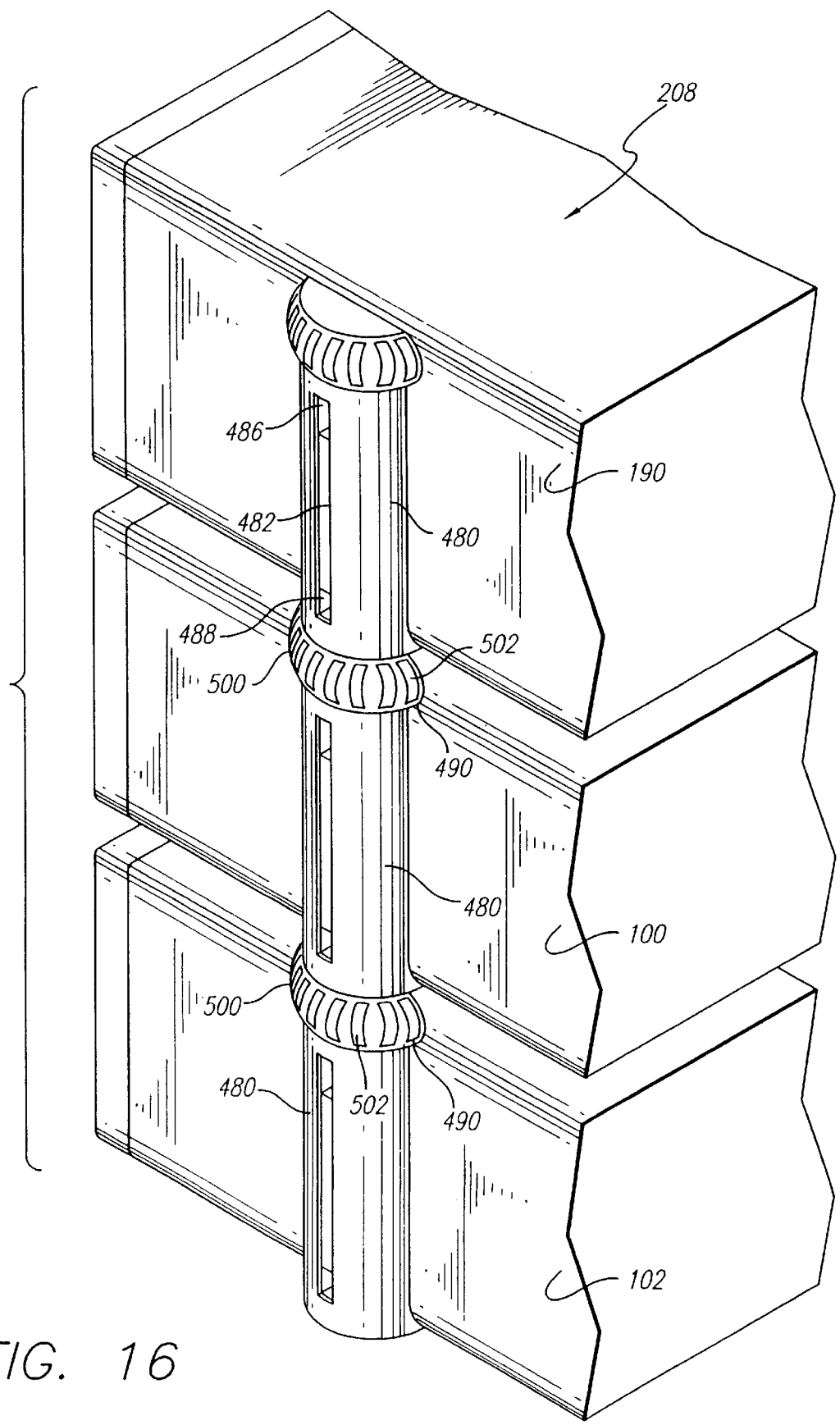
FIG. 16 shows another alternative embodiment.

An interesting design of this invention with the back portions 480 being semicircular and having a vertical slot 482 is shown at 208 in FIG. 16. However, the slot 482 does not extend the full height but rather ends with the access through-openings 486, 488 at both ends thereof. The body portion of the connector device 490 is configured so that it has a bulge portion 500, which bulges out slightly away from the plane of the back portions. It also has vertical arcuate slots or depressions 502 spaced about its circumference. These slots 502 also do not extend the full height of the body portions, similar to the slots of the brackets not extending the full height thereof. The trim cap 510 also has a bulging portion 512 with slots 514 and flat top 516.

Figure 17:
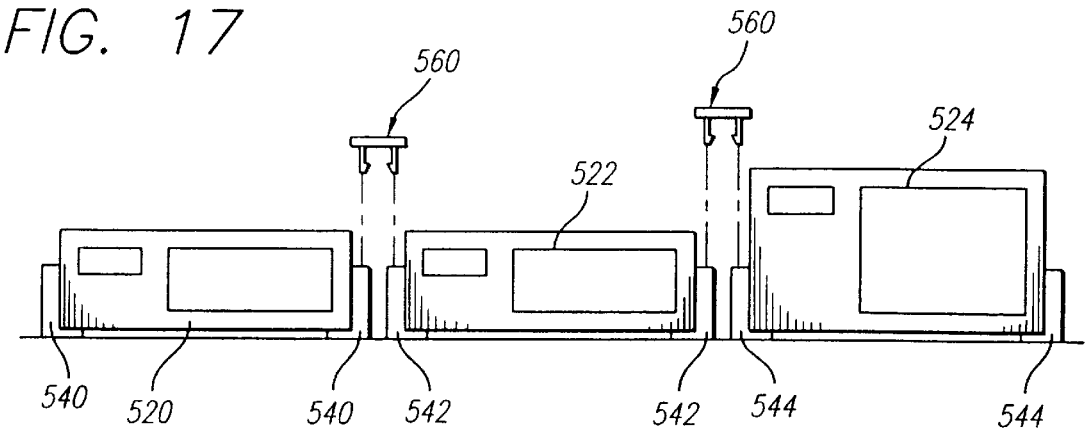
FIG. 17 is a partially exploded, side elevational view of an alternative side-by-side interconnecting assembly of the present invention.
Figure 18:
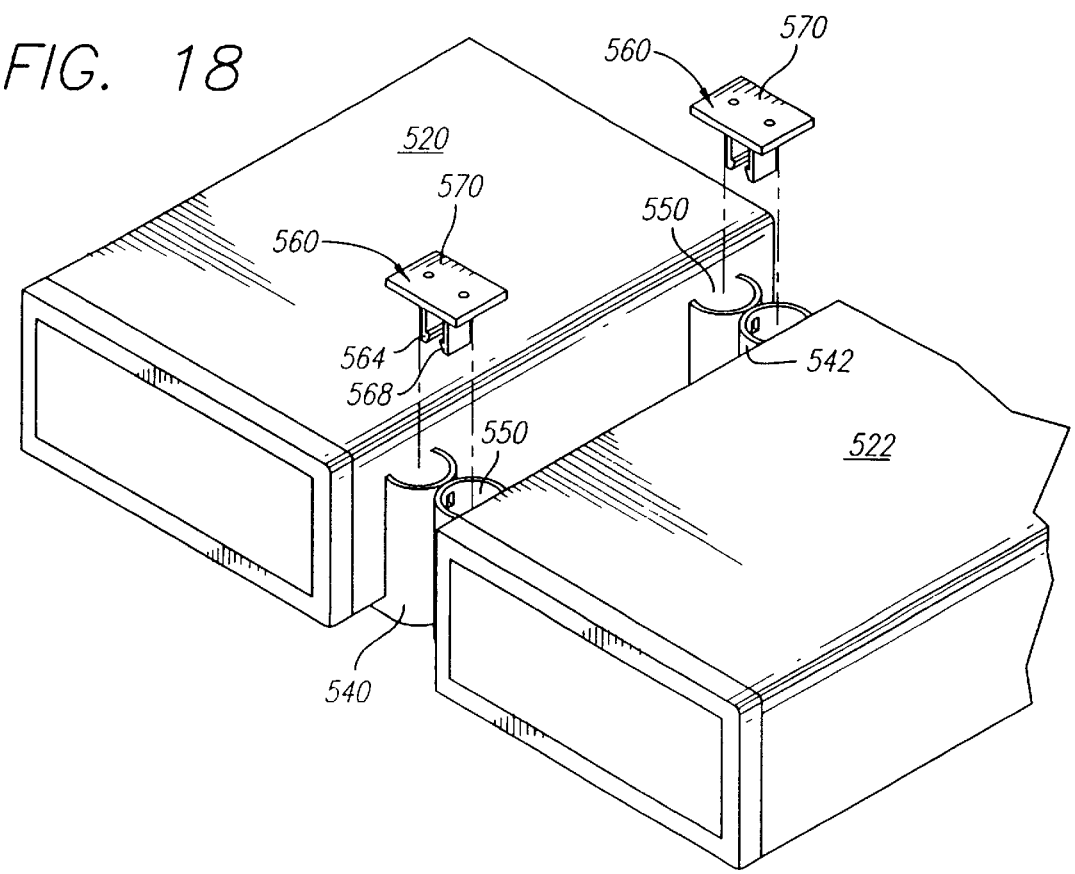
FIG. 18 is a top perspective view of a portion of the assembly of FIG. 17.
Figure 19:
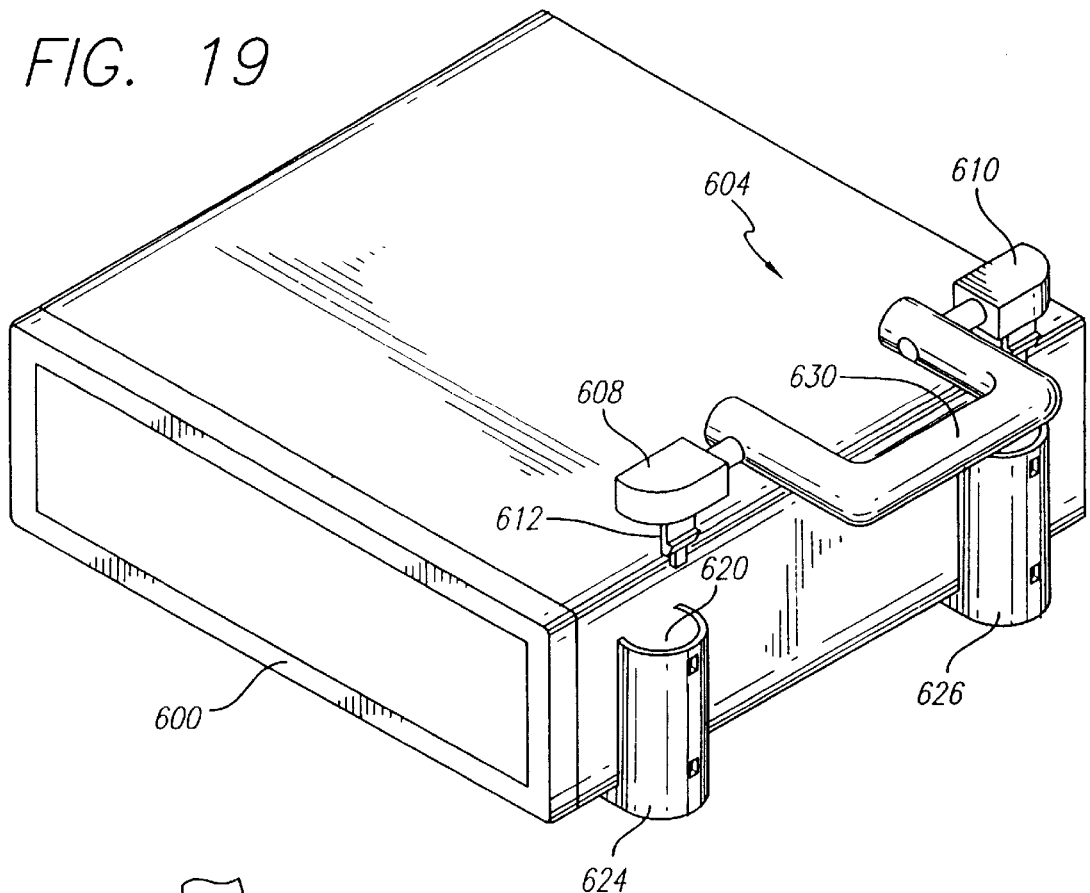
FIG. 19 is a partially exploded perspective view of a handle system of the present invention.

The connector devices (e.g., 160) described above each have a body member with the locking resilient hook type locks extending linearly out opposite ends thereof so as to connect together two units (housings, computer peripheral device enclosures, etc.), stacked one on top of the other. However, it is also within the scope of the invention to interlock units 520, 522, 524 in a side-by-side relation, as best shown in FIGS. 17 and 18. It is seen therein that similar L-shaped brackets 540, 542, 544 are attached to each of the units. Similar to the one-on-top-of-the-other arrangement (as shown in FIG. 1, for example), four brackets are preferably used for each unit, two spaced relative to one another on opposing sides of the unit. The back portions of the L-shaped brackets similarly each have top (and bottom) opening(s) 550 and associated locking ridges inside on the front interior surface.

The interlocking devices 560 have a similar type of hook-type arrangement with two hooks 564, 568 protruding out from a body 570. The hooks 564, 568, however, extend parallel to one another (and not in an opposite linear fashion like in the previous interlocking device); that is, they form an inverted U-type shape when viewed from the side. They extend parallel to one another with the hooks 564, 568 themselves facing one another and from the same side of the body member 570. The body member 570 can be shaped simply like a thick plate. To release the snapped-in hook locks (which have the same type of resilient snap locking function as the previously described embodiment), openings are provided in the back portions of the brackets 540, 542. The access openings can be provided in the sides as opposed to the front of the back portion to make them a little more accessible, with the L-shaped brackets of opposing units 520, 522 (or 522, 524) in a close back-to-back interlocked relationship as shown in FIGS. 17 and 18.

Figure 20:
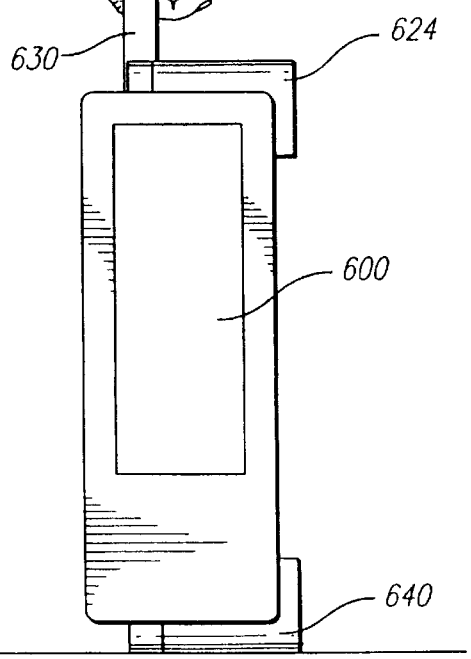
FIG. 20 is a reduced view of the system of FIG. 19, shown in use.

Another embodiment of the present invention uses the same type of four L-shaped brackets secured to the unit. However, instead of interlocking that unit 600 together with another unit, a handle assembly as shown generally at 604 is provided. At opposite ends of the assembly 604 are body members 608, 610 each with a respective laterally protruding hook 612. These hooks 612 are shaped similar to the previously-described hooks and function the same way to resiliently snap down into the top openings 620 of the back portions 624, 626 and lock therein onto the internal ridges. Between a pair of these body portion and hook members, the handle portion 630 is interconnected with a swivel relationship. Thus, with the body portions snapped into place and to the L-shaped brackets 624, 626 on the same side of the unit 600, a secure interlock is provided. The unit can be lifted by grasping the handle 630 as shown in FIG. 20. FIG. 20 also shows that the opposite L-shaped brackets 640 of the unit conveniently form support feet for the unit 600, protecting it from impact and scratching and other damage, and also providing for a stable support for the unit.

Figure 21:
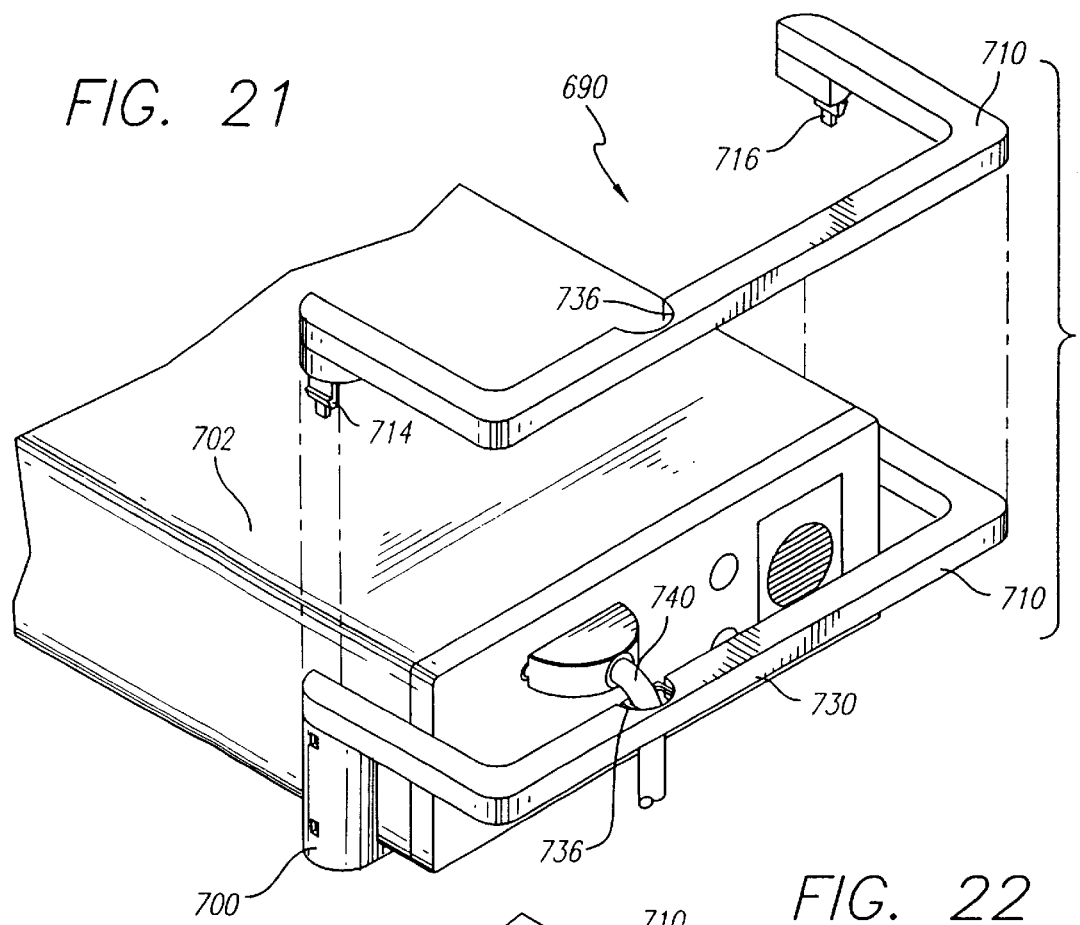
FIG. 21 is a perspective view of a snap-in cable manager assembly of the present invention.

FIG. 21 illustrates another embodiment generally at 690 of the invention which similarly has the four L-shaped brackets 700 attached to the unit 702. In this embodiment, however, a U-shaped cable manager unit shown generally at 710 is provided having connectors 714, 716, at opposite ends thereof. The embodiment 690 of FIG. 21 shows downwardly-disposed snap-type connectors 714, 716 which snap down into the top openings in the back portions 700 of the brackets, with a releasable resilient snap-in function similar to that previously described for the interconnector device and other embodiments. The central portion 730 of the U-shaped unit 710 has a recess, a snap-in clip or the like 736 to hold and retain the cable or gathered cables 740 of the unit 702, which as previously mentioned can be a computer peripheral unit.

Figure 22:
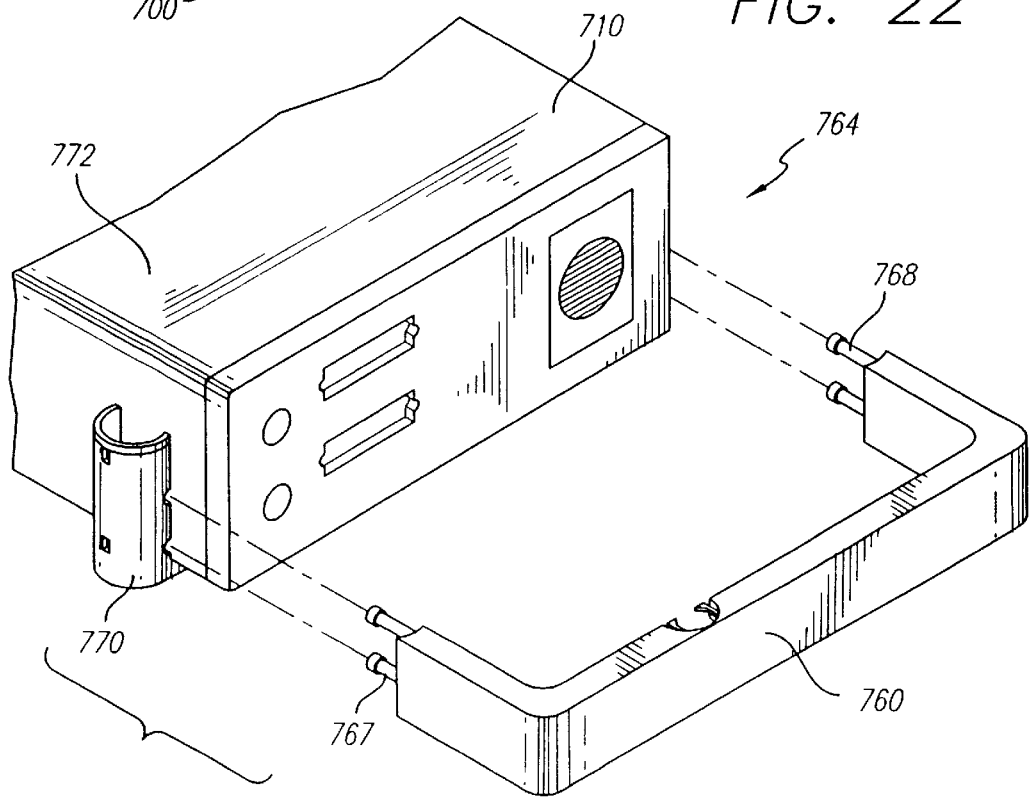
FIG. 22 is a perspective view of an alternative snap-in cable manager assembly.

In contrast, the cable manager unit 760 of the embodiment 764 of FIG. 22 snaps with plugs 766, 768 into side (as opposed to top) openings 770 of the back portion 772. An advantage of this design is that another unit can be stacked onto this unit and snapped down into the top openings with interlocking devices of the L-shaped brackets 806, 810. This can be in an arrangement like that of the assembly in FIG. 1. Unlike the handle 604 which uses brackets on the same side of the unit, the cable manager units 710 and 760 use brackets on opposite sides of the unit.

Figure 23:
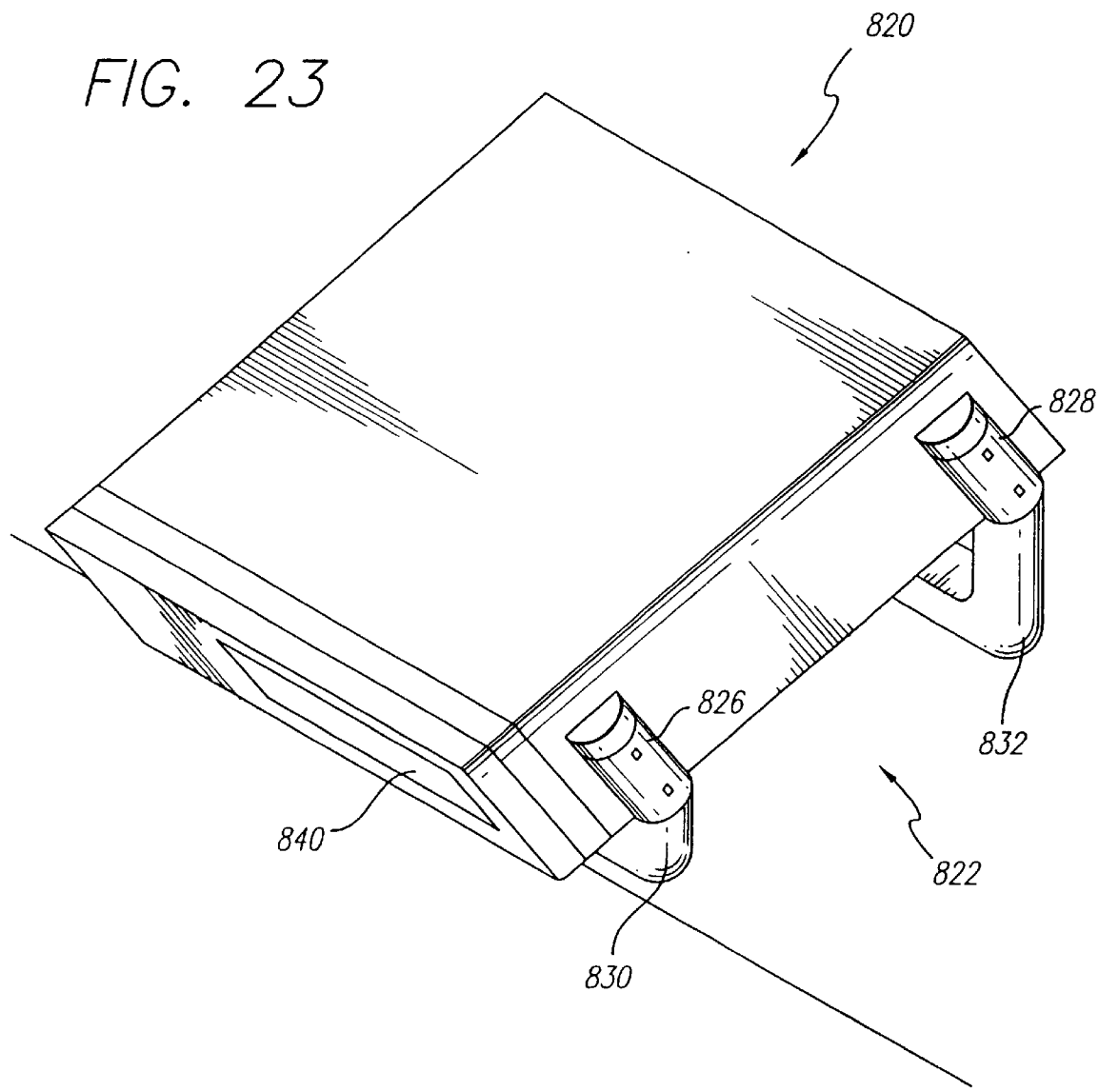
FIG. 23 is a perspective view of a snap-in angled support assembly of the present invention.

Another use of these L-shaped brackets and snap-in connectors is illustrated in FIG. 23 generally at 820. Shown therein is a support or leg system 822 which snaps into the bottom openings of the L-shaped brackets 826, 828. Since the legs 830, 832 are of different sizes (heights) or angles, the unit 840 then slopes at a desired angle, to the front (or back) and/or side as desired for different uses.

Figure 25:
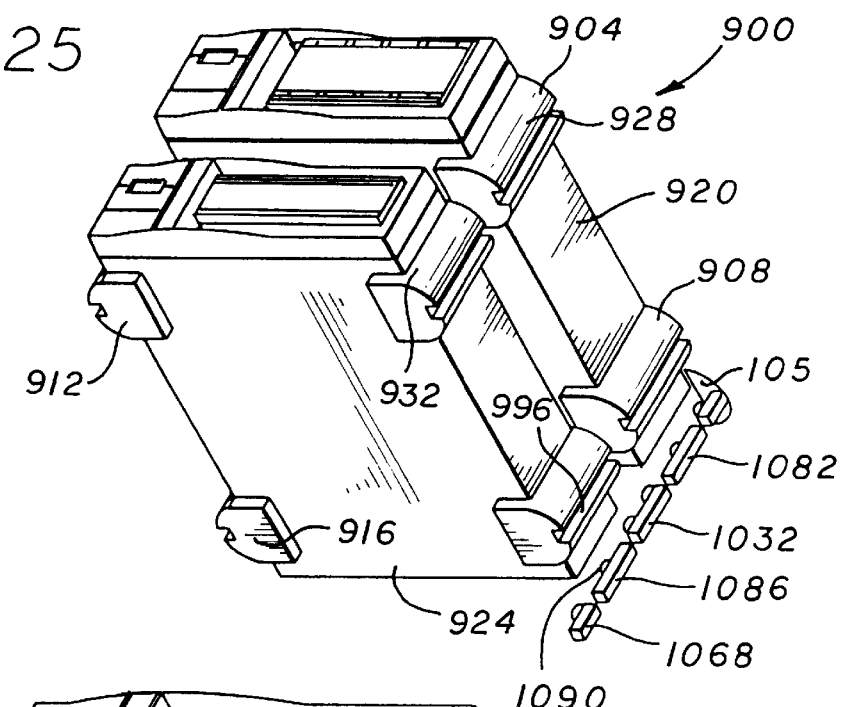
FIG. 25 is an exploded bottom perspective view of the system of FIG. 24.

Referring to FIGS. 24 and 25, another system of the present invention is illustrated generally at 900, and a number of different versions or arrangements thereof are shown to better explain the flexibility of this system. The system 900 comprises four assemblies 904, 908, 912, 916—two (904, 908) spaced on one side of the stacked units 920, 924 and the other two (912, 916) spaced on the opposite side of the units. Each assembly is the same. Each assembly includes for each unit 920, 924 an L-shaped bracket 928, 932, which is secured with a. screw 936 up through a hole in the foot portion 944 of the bracket into a preformed hole in the bottom of the unit. Each of the foot portions 944 has a top flat member 956 with a screw hole and peripheral downward flanges 972 forming a downward cup for receiving the screw 936 therein, as shown in FIG. 31, for example. Ribs 980 extending inward from the flanges 972 generally abut the screw 936. Thereby the screw 936 is not exposed to rest on and scar a (computer peripheral) unit or other surface therebeneath. The back portion 988 of the bracket extends then up along the side or end of the unit.

The back or upright portion 988 of the bracket has a vertical slot 996 extending the length of the center of the front face thereof. The back or inside portion or surface 1004 of the bracket has a curved configuration. A center rib 1012 extends the length of the back portion 988, extending rearwardly on the back face thereof. A plurality of holes 1020 disposed in the slot 996 extend through the back portion 1004 and through the rib 980. At least three holes 1020, and preferably four (or five), are provided for each bracket, spaced generally equally along the length of the slot.

A number of different snap-fit members are provided, each including a post for snap-fitting into a respective one of the holes 1020 and a bar for the slot 996. One of the principle one of these members is a connector member or device 1028 having a bar 1032 and two posts 1036, 1040 extending perpendicularly and rearwardly therefrom at spaced locations. Another is a top cap member (or trim cap) 1048 having a short bar 1052, a relatively thin flat plate cap 1056 at the top of the short bar, and a top cap post 1060 extending perpendicularly from the bar, below the cap. A third is a bottom member 1068 having a short bar 1072 and a post 1076 extending rearwardly therefrom generally at an upper portion of a back face thereof. A fourth snap-fit member of this invention is a central member 1082 having an elongate bar 1086 (which is generally longer than the bars of the three previously-described members). A post 1090 extends rearwardly from a center of a rear face of this bar 1086. One or more additional posts can be provided for the central member 1082 as desired.

A number of these four snap-fit members 1028, 1048, 1068, 1082 and the brackets are sold to the user in a kit form. Preferably they are sold loose in a plastic bag 1090, together with an instruction sheet 1094 with instruction indicia 1096. They can be sold in the bag 1090 with the top cap member 1048, bottom member 1068 and central member 1082 snap-fit on the bracket as a snap-fit unit 1000. This is shown in FIG. 47. A folded-over cardboard flap 1098 is stapled or otherwise secured to the open top mouth of the bag 1090 to secure the bag closed. Additional labeling, pictures and instruction indicia 1102 can be printed on the flap 1098 as desired. Of course, other packaging or enclosures, such as small cardboard boxes, can be used instead of the plastic bag 1090.

With the flap 1098 torn off, the bag 1090 opened and the pieces removed, the assemblies 904, 908, 912, 916 can be assembled. As mentioned above, each of the brackets 928, 932 is screwed onto the desired units, with screws 936. With the units 920 stacked one on top of the other and respective brackets 928, 932 aligned, the connector members 1028 are snapped into place. One of the connector member posts 1036 is snapped into the bottom hole in the bracket 928 of the top unit 920, and the other post 1040 is snapped into the top hole of the bracket 932 of the bottom unit 924. One portion of the bar 1032 thereby fits into the bottom portion of the slot 996 of the bottom bracket and another portion in the top portion of the slot in the top bracket. Preferably, the posts 1036, 1040 are pushed into their respective holes at the same time.

With the connector members of each of the four assemblies 904, 908, 912, 916 snapped into place, the two units 920, 924 are interconnected together so as to not slide off one another. However, when the two units 920, 924 are picked up, they preferably should still be picked up from the bottom of the bottom unit 924. In other words, the system 900 may not be reliably strong enough to securely hold the bottom unit 924 to the top, when both are heavy, if only the top unit 920 is lifted, especially when the units are also subjected to a significant lateral force when lifted.

Many units can be stacked one on top of another with the connector members snapped into place interconnecting the adjacent brackets and thereby the adjacent units. For example, FIG. 32 shows two large units 1100, 1104, one on top of the other, and a smaller unit 1108 on top of the uppermost large unit, with the connector assemblies 1110, 1114, 1118, 1122 stacked three brackets 1124, 1126, 1128 high with connector members 1128 snap-fit connecting the adjacent brackets. As shown therein, larger or longer brackets 1126, 1128, which are identical to each other, are used for the taller units. Bracket 1124 is identical to brackets 928, 932. Each of the brackets extends to the top of its unit, as depicted in the drawings.

FIG. 39 (and FIGS. 40–45) show a system 1130 wherein a smaller unit 1132 is stacked on a larger (or taller) unit 1134 and the two are interconnected by assemblies 1136, 1138, 1140, 1142. Each assembly includes a short bracket 1144 attached to the smaller unit 1132 and a longer bracket 1146 attached to the larger unit 1134. The short bracket 1144 can be identical to brackets 928, 932, 1124. And the longer bracket 1146 can be identical to brackets 1126, 1128.

To dress up and complete the assembly (e.g., 904, 908, 912, 916, 1110, 1114, 1118, 1122), one of the top cap members 1048 is snap fit to the top of each of the top brackets. That is, the post 1060 of each top cap member 1048 is snapped into the top hole of the respective bracket with the bar 1052 in the upper portion of the slot. The top plate or cap member 1048 will thereby cover the top of the bracket, and the end of the slot will be hidden.

Additionally, the bottom member 1068 is snap fit onto the end of the bottom bracket. That is, the bottom member post 1076 is snapped into the bottom hole of the bottom bracket with the bottom member bar 1072 fit into the bottom end of the slot of the bottom bracket.

A central bar 1086 of the appropriate length to fill in the rest of the slot 996 between the bottom member 1068 and the connector member 1028 or between the connector member and top cap member 1048 is snap fit into the slot with the center member post 1090 fit in to the hole. The center member bar 1086 thereby is fit in and lies in the slot 996. The center member 1086 is selected with a length so as to not cover the top and bottom holes in the slot. For example, a longer bar 1192 can be used for the longer brackets such as 1126, 1128 and 1146.

The respective bars of each of the center, bottom, connector and top cap members 1082, 1068, 1028, 1048 are dimensioned and curved on their outer faces so that with the respective member snapped into place the bar curves with and conforms to the curvature of the surface of the surrounding bracket. Thereby smooth curving assembly back portion bodies are formed. No portions stick out to catch on any articles, and no portions are recessed so as to tend to collect dirt. Further, a geometrically attractive and aesthetically appealing configuration is formed.

When a unit is not stacked, brackets 928, 932 are still secured thereto and top cap members 1048, bottom members 1068 and center members 1086 snapped into place. The foot portions 944, 948 of the brackets protect support surfaces from being scratched by the bottoms of the units (and by the screws). The assemblies are thereby ready for easy stacking, with flexibility to be top, middle or bottom stacked units. When it is to be a top unit of the stack of units, the bottom members 1068 are removed from the respective brackets and the connector members 1028 snapped into the bottom exposed holes. When it is to be a bottom unit, the top cap members 1048 are unsnapped removed from the respective brackets and the connector members 1028 snapped into place in the exposed top and bottom holes. Any desired stacking, unstacking and restacking of the units can thereby be easily accomplished.

In other words, disclosed herein is an assembly for interlocking various computer peripheral enclosures to prevent them from falling off of desk tops or off of each other, to compactly organize them to save space and prevent disconnection or tangling of their connecting wires, to more easily and securely move them from one location to another, and to provide an attractive interlocking arrangement. L-shaped brackets are secured to the enclosures or housings, preferably at the enclosure bases, and extending up their sides. Interlocking devices have snap-in members at each end thereof. One member snaps into an opening in a bracket of one enclosure unit and another member snaps into an opening in a bracket of another enclosure unit, thereby the two units are securely held together in a one-on-top-of-the-other (or side-by-side) arrangement. Insertion of a narrow tool into an opening in the bracket allows for easy unsnapping or disconnect, according to one embodiment. Another preferred embodiment discussed in detail herein does not need a tool for disassembly; only the user's fingers are needed. Optional carrying handle, cable manager, and angled foot support embodiments are also disclosed herein for releasable snap fit attachment to the brackets.

From the foregoing detailed description, it will be evident that there are a number of changes, adaptations and modifications of the present invention which come within the province of those skilled in the art. However, it is intended that all such variations not departing from the spirit of the invention be considered as within the scope thereof as limited solely by the claims appended hereto.

What is claimed is:

1. An interlocking assembly, comprising:
    a first L-shaped device having generally perpendicular first back and foot portions, said first device being adapted to attach to a first unit with said first foot portion substantially along a bottom of the first unit and said first back portion substantially along a side or end of the first unit, said first back portion having a first opening;
    a second L-shaped device having generally perpendicular second back and foot portions, said second device being adapted to attach to a second unit with said second foot portion substantially along a bottom of the second unit and said second back portion substantially along a side or end of the second unit, said second portion having a second opening; and
    an interlocking device having a body portion, first locking means for insertion into said first opening and snap-fit locking said body portion to said first back portion, and second locking means for insertion into said second opening and snap-fit locking said body portion to said second back portion.

2. The assembly of claim 1 wherein said body portion comprises an interlocking bar, said first locking means comprises a first post extending perpendicularly from said interlocking bar for insertion into said first opening, and said second locking means comprises a second post spaced from said first post and extending perpendicularly from said interlocking bar for insertion into said second opening.

3. The assembly of claim 2 wherein said interlocking device is adapted to interlock the first unit on top of the second unit.

4. The assembly of claim 3 wherein said first opening defines a lower opening, said first back portion includes an upper opening spaced above said lower opening, and said first back portion includes a top end, and further comprising a top cap device having a top cap member and a top cap post adapted to fit in said upper opening and thereby position said top cap member above and generally on said top end.

5. The assembly of claim 4 wherein said top cap device includes a connector bar to which said top cap member and said top cap post are secured.

6. The assembly of claim 5 wherein said first back portion has a vertical slot extending the length of a forward face thereof, a portion of said interlocking bar being disposed in said slot when said first post is fit in said lower opening and said connector bar being disposed in said slot when said connector post is in said upper opening.

7. The assembly of claim 6 further comprising a center bar which fits into said slot between said interlocking bar and said connector bar.

8. The assembly of claim 7 wherein said first back portion has a center bar hole, and said center bar has a center bar post which fits into said center bar hole.

9. The assembly of claim 8 wherein said upper hole, said center bar hole and said lower hole are disposed in said slot.

10. The assembly of claim 7 wherein outer surfaces of said connector bar, said center bar and said top cap bar when in said slot are generally flush and conforming with adjacent outer surfaces of said first back portion.

11. The assembly of claim 7 further comprising a bottom bar attachable to said second L-shaped device below said interlocking device.

12. The assembly of claim 11 wherein said bottom bar includes a bottom bar post which fits into a lower opening of said second L-shaped device.

13. The assembly of claim 11 wherein said second back portion has a vertical slot extending the length of a forward face thereof, a lower portion of said interlocking bar and said bottom bar being disposed in said vertical slot.

14. The assembly of claim 1 wherein said second opening defines an upper opening, said second back portion has a lower opening, said interlocking device defines a first interlocking device, and said body portion defines a first body portion; and further comprising a third L-shaped device adapted to attach to a third unit and having a third opening, and a second interlocking device having a second body portion, third locking means for insertion into said lower opening and snap fit locking said second body portion to said second L-shaped device and fourth locking means for insertion into said third opening and snap fit locking said second body portion to said third L-shaped bracket.

15. The assembly of claim 14 wherein said first and second interlocking devices are adapted to interlock the first, second and third units, stacked one on top of the other.

16. The assembly of claim 14 wherein said second body portion comprise a second interlocking bar, and said third and fourth locking means comprise third and fourth posts spaced from one another and extending out from said second interlocking bar.

17. An interlocking kit, comprising:
    a first L-shaped bracket having generally perpendicular first back and foot portions, said first back portion having a front longitudinal first slot and a first opening in said first slot;
    a second L-shaped bracket having generally perpendicular second back and foot portions, said second back portion having a front longitudinal second slot and a second opening in said second slot; and
    a connector member having a connector bar, a first connector post extending generally perpendicularly out from said connector bar and a second connector post extending generally perpendicularly out from said connector bar and spaced from said first connector post and generally perpendicular thereto;
    said connector member is positionable in an interconnecting position relative to said first and second L-shaped brackets with said first connector post snap fit into said first opening and a first portion of said connector bar in said first slot and said second connector post fit into said second opening and a second portion of said connector bar in said second slot;
    wherein with said first L-shaped bracket secured in position to a first unit, said second L-shaped bracket secured in position to a second unit and said connector member in the interconnecting position, the first and second units are interconnected stacked one on top of the other.

18. The kit of claim 17 further comprising a package for holding said first and second L-shaped brackets and said connector member.

19. The kit of claim 17 wherein said second L-shaped member has a third opening in said second slot, and further comprising a center member having a center bar and a center bar post extending perpendicularly out from said center member, said center bar being securable in said second slot with said center bar post in said third opening.

20. The kit of claim 17 wherein said first L-shaped member has a third opening in said first slot and a top end, and further comprising a top cap member having a top cap bar, a top cap element generally on top of said top cap bar and a top cap post extending perpendicular out from said top cap bar, wherein with said top cap bar secured in said first slot with said top cap post in said third opening, said top cap element is disposed generally on top of said end.

21. An interlocking assembly, comprising:
   a first L-shaped device having generally perpendicular first back and foot portions;
   a second L-shaped device having generally perpendicular second back and foot portions; and
   an interlocking device having a first lock portion which is locked to said first L-shaped device and a second lock portion which is locked to said second L-shaped device and thereby interlock said first and second L-shaped devices in an interlocked position.

22. The assembly of claim 21 wherein said first lock portion includes a first snap-fit lock device and said second lock portion comprises a second snap-fit lock device.

23. The assembly of claim 22 wherein said first L-shaped device includes a first opening, said second L-shaped device includes a second opening, and when said first and second L-shaped devices are in the interlocked position, said first snap-fit lock device is locked into said first opening and said second snap-fit lock device is locked into said second opening.

24. An interlocking assembly, comprising:
   a first L-shaped bracket having generally perpendicular first back and foot portions, said first back portion having a first opening;
   a second L-shaped bracket having generally perpendicular second back and foot portions, said second back portion having a second opening; and
   a connector member having a body member and first and second male members attached to said body member, said first male member being fitted into said first opening and said second male member being fitted into said second opening.

25. The assembly of claim 24 wherein said first male member extends perpendicular relative to said body portion, said first opening extends laterally relative to said first back portion, said first back portion includes a longitudinal slot, said first opening is disposed in said slot, and a portion of said body portion is fitted in said slot.

26. The assembly of claim 24 further comprising a top cap member fitted on top of said first L-shaped bracket and a bottom member fitted on a lower end of said L-shaped bracket.

\* \* \* \* \*